United States Patent
Consiglieri et al.

(10) Patent No.: US 11,146,267 B1
(45) Date of Patent: Oct. 12, 2021

(54) CHARGE RECOVERY DRIVER FOR MEMS MIRROR WITH REDUCED NUMBER OF TANK CAPACITORS

(71) Applicant: STMicroelectronics S.r.l., Agrate Brianza (IT)

(72) Inventors: Franco Consiglieri, Piacenza (IT); Pasquale Flora, Varese (IT); Marco Zamprogno, Cesano Maderno (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/106,574

(22) Filed: Nov. 30, 2020

(51) Int. Cl.
  *H03B 1/00* (2006.01)
  *H03K 3/00* (2006.01)
  *H03K 17/687* (2006.01)
  *G02B 7/182* (2021.01)

(52) U.S. Cl.
  CPC ......... *H03K 17/6871* (2013.01); *G02B 7/182* (2013.01)

(58) Field of Classification Search
  CPC .................................................. H03K 17/6871
  USPC ......................................................... 327/111
  See application file for complete search history.

(56) References Cited

U.S. PATENT DOCUMENTS

| | | | |
|---|---|---|---|
| 5,559,402 A | 9/1996 | Corrigan, III | |
| 2013/0038298 A1* | 2/2013 | Yen | G09G 3/3685 320/166 |
| 2013/0234513 A1* | 9/2013 | Bayer | H02J 1/08 307/31 |
| 2015/0061410 A1* | 3/2015 | Tamura | H03K 19/0019 307/126 |
| 2016/0048260 A1 | 2/2016 | Ivanov et al. | |
| 2020/0106356 A1 | 4/2020 | Petersen | |

FOREIGN PATENT DOCUMENTS

KR   10463046 B1   12/2004

OTHER PUBLICATIONS

Li Yanqiao et al: "An 80-117V Pseudo-Adiabatic Drive Circuit for Microrobotic Actuators with Optical Power Delivery and Peak Power Reduction Factor over 14x," 2020 IEEE Custom Integrated Circuits Conference (CICC), Mar. 22-25, 2020, 4 pages.

Khorami Ata et al: "An Efficient Fast Switching Procedure for Stepwise Capacitor Chargers," IEEE Transactions on Very Large Scale Integration (VLSI) Systems, vol. 25, No. 2, Feb. 2017, pp. 705-713.

(Continued)

*Primary Examiner* — Metasebia T Retebo
(74) *Attorney, Agent, or Firm* — Crowe & Dunlevy

(57) ABSTRACT

A charge recovery driver is for a pair of loads, and includes first and second output nodes coupled to a pair of loads. During an initial phase, the first output node is grounded and the second output node is tied to the supply voltage. During a first phase, the first output node is coupled to the first tank capacitor and the second output node is coupled to the second tank capacitor. During a second phase, the first and second output nodes are coupled to one another. During a third phase, the second output node is coupled to the first tank capacitor and the first output node is coupled to the second tank capacitor. During a fourth phase, the first output node is coupled to the supply voltage and the second output node is coupled to ground. The third, second, and first phases are then repeated in that order.

43 Claims, 12 Drawing Sheets

(56) References Cited

OTHER PUBLICATIONS

Nakata Shunji et al: "General Stability of Stepwise Waveform of an Adiabatic Charge Recycling Circuit With Any Circuit Topology," IEEE Transactions on Circuits and Systems—I: Regular Papers, vol. 59, No. 10, Oct. 2012, pp. 2301-2314.

* cited by examiner

FIG. 2A
(Prior Art)
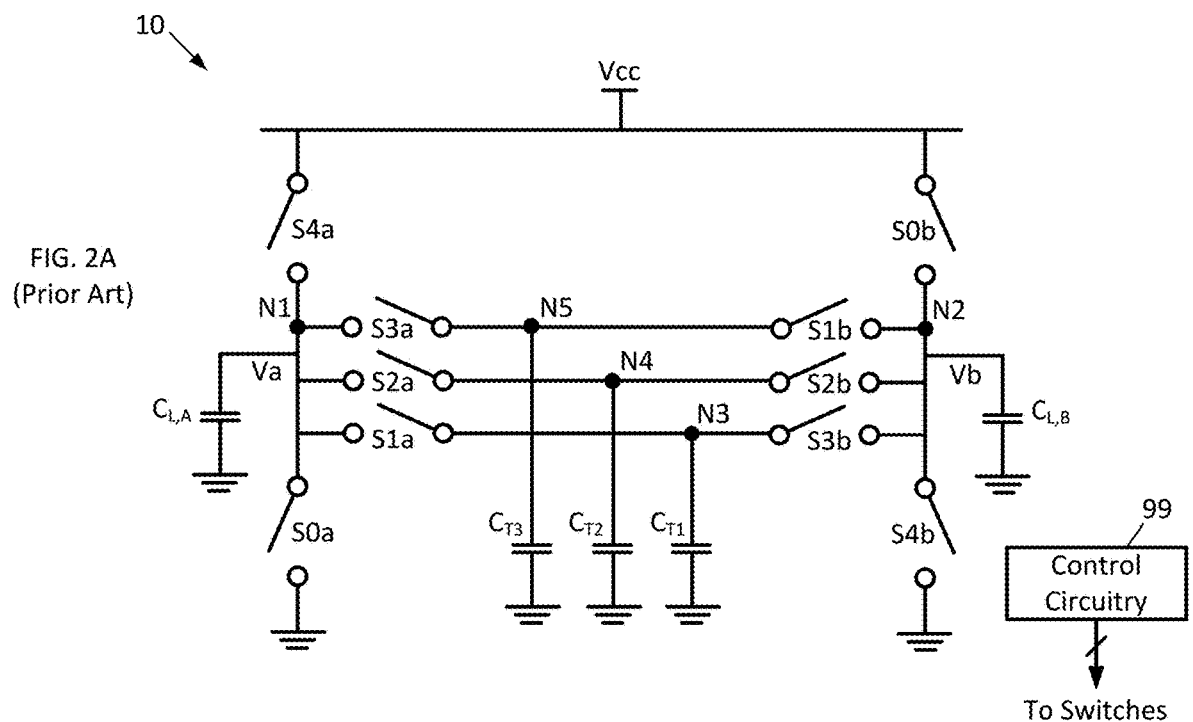
FIG. 2B
FIG. 2C
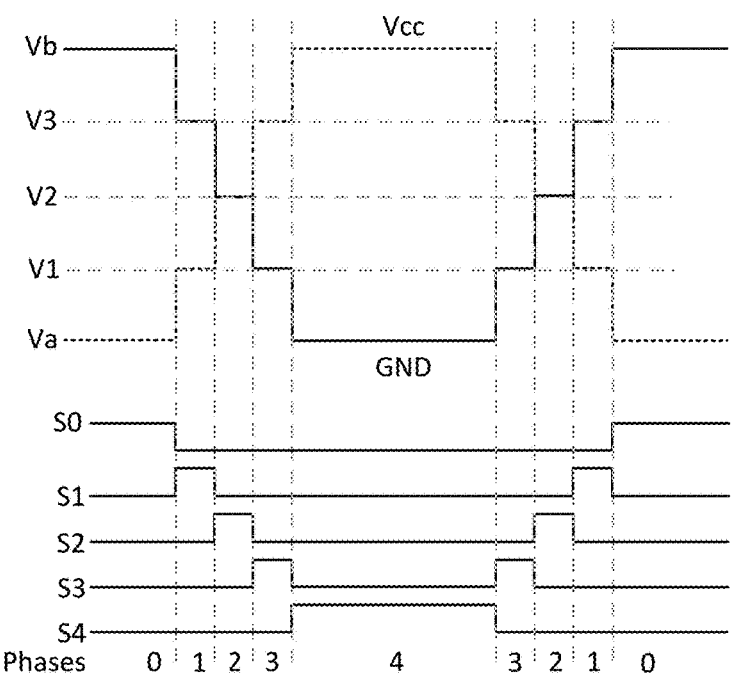

FIG. 3A
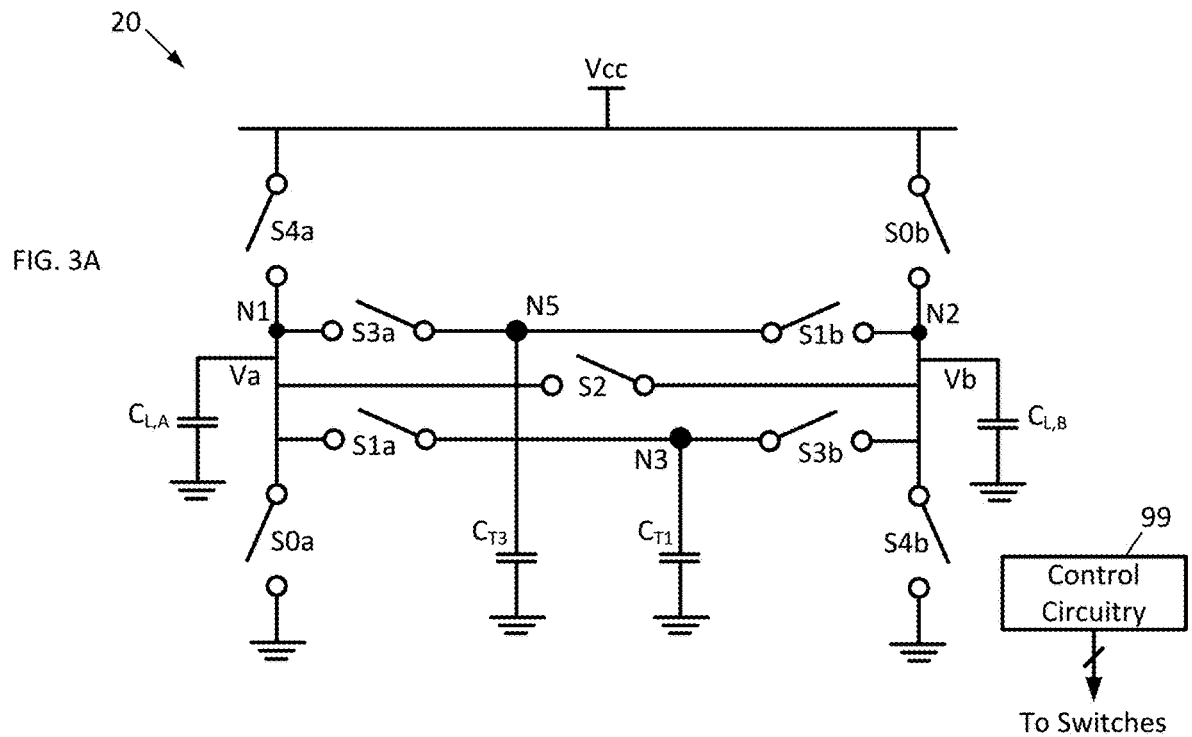
FIG. 3B
FIG. 3C
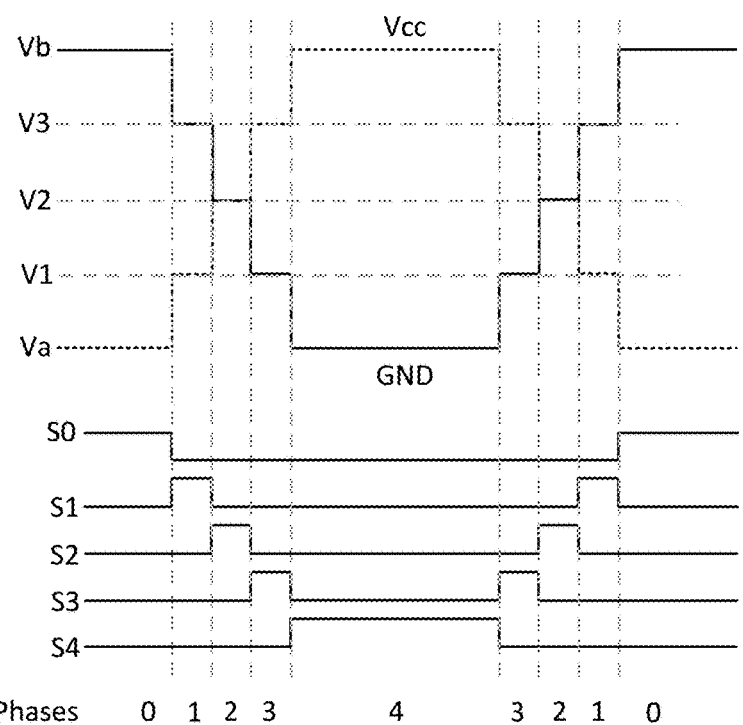

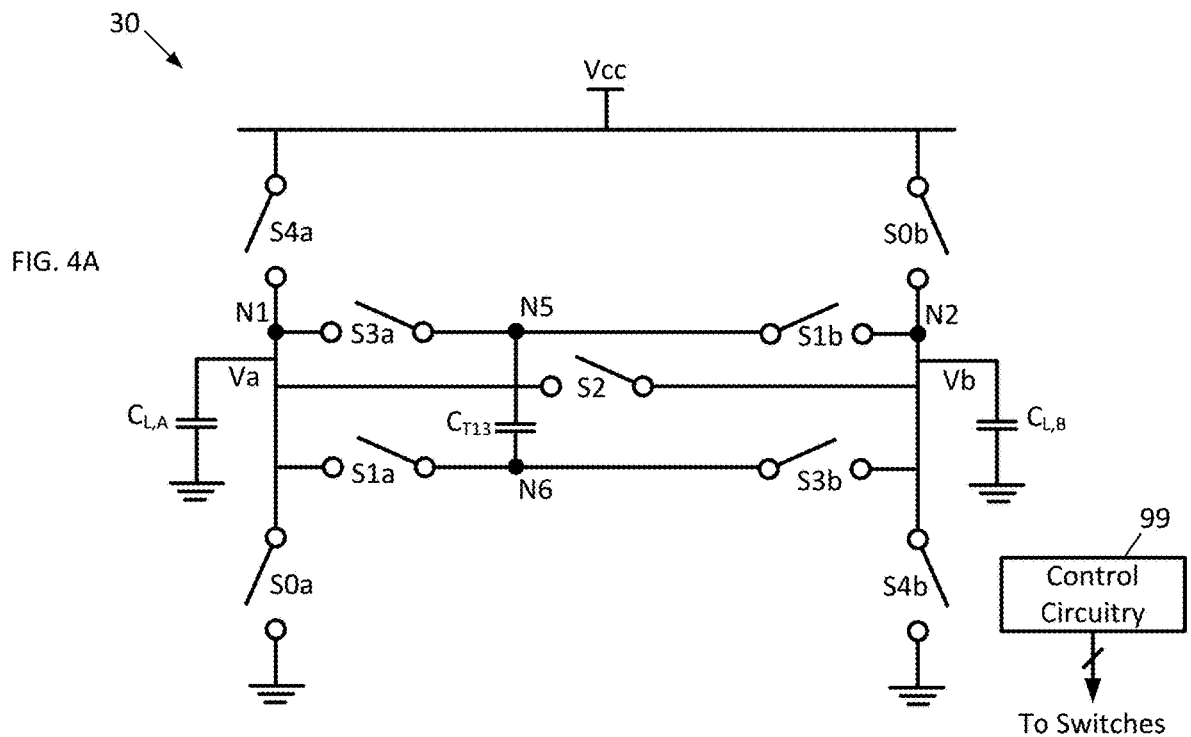
FIG. 4A
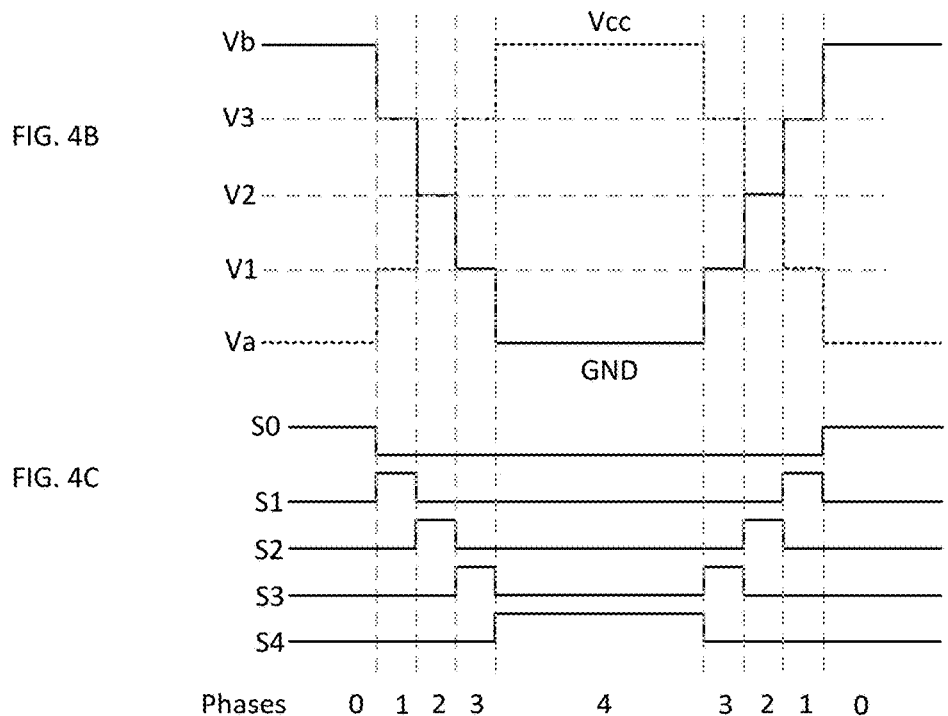
FIG. 4B
FIG. 4C

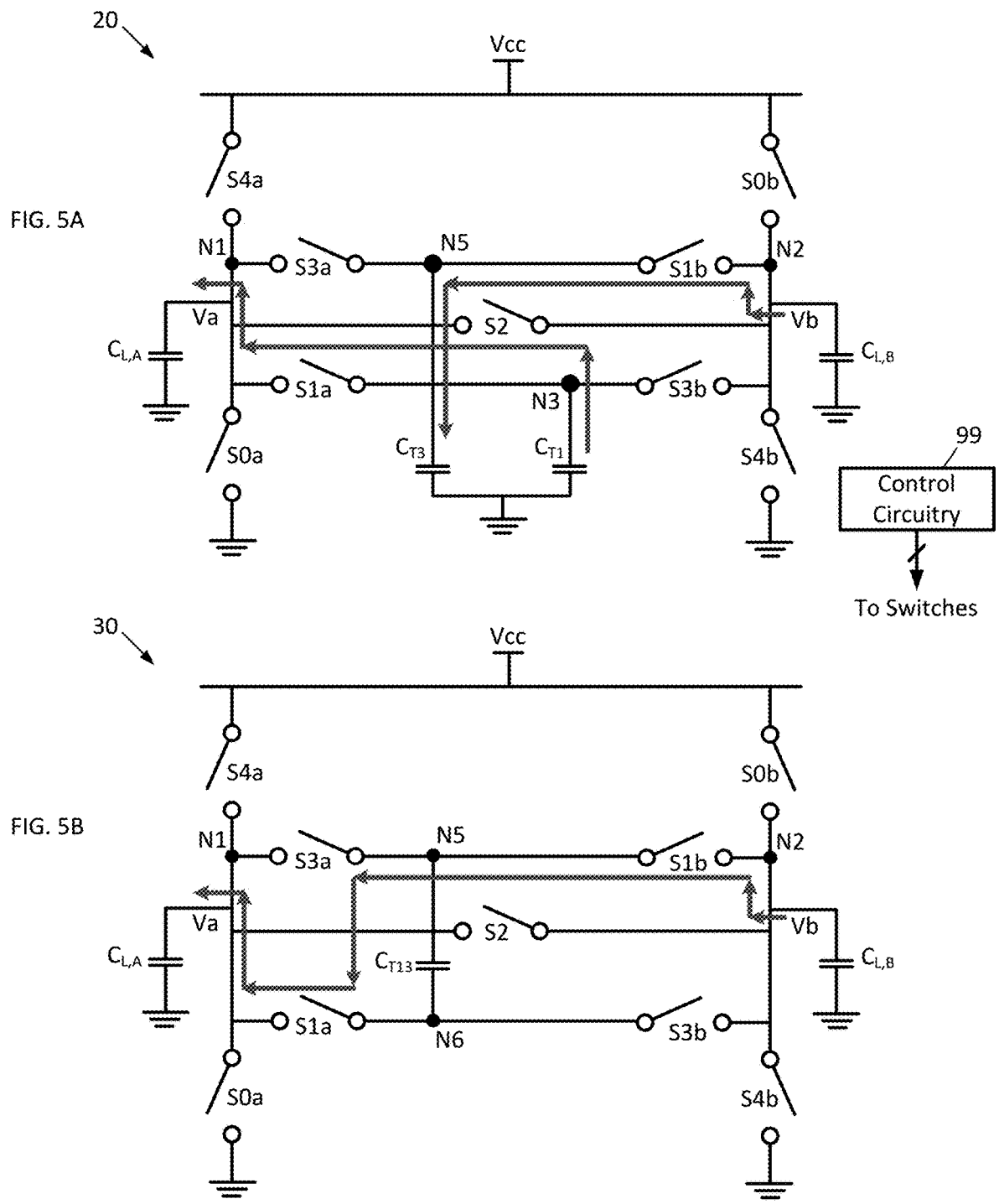

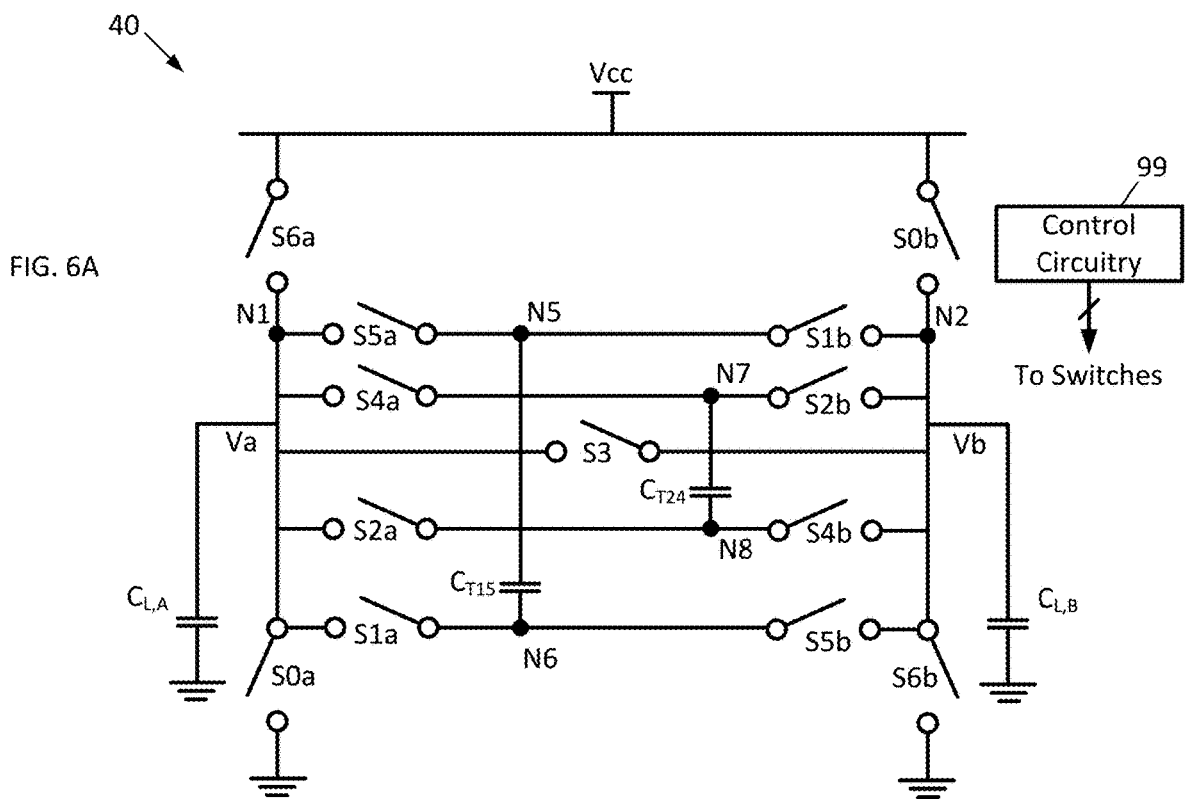
FIG. 6A
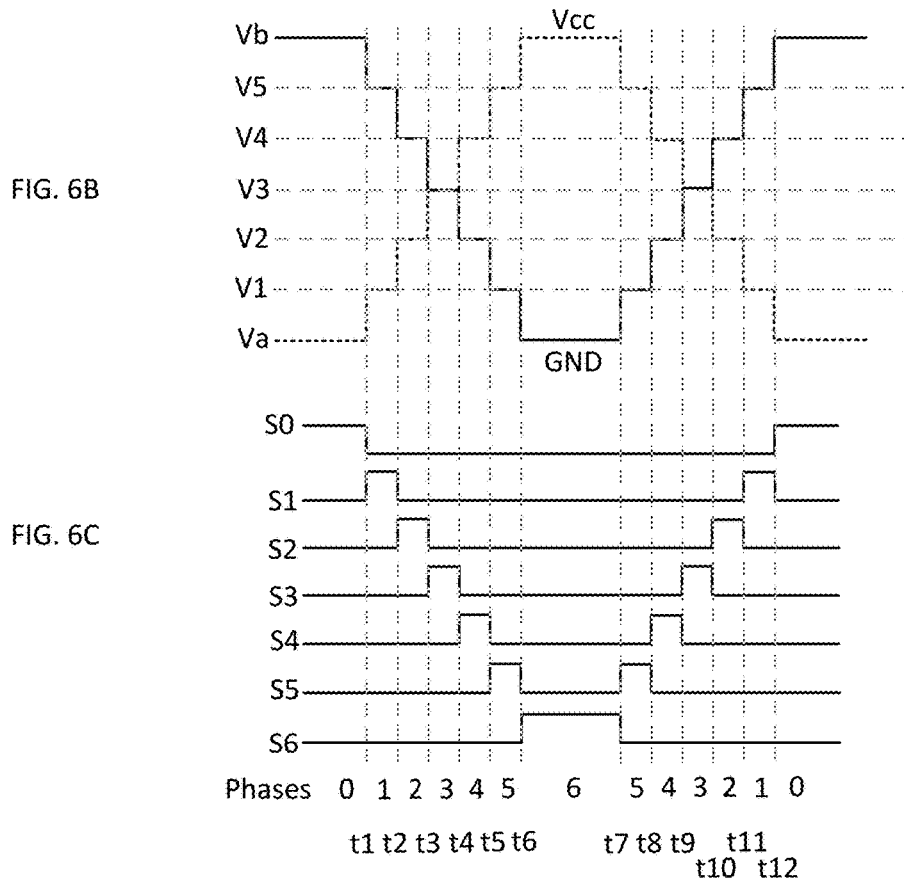
FIG. 6B
FIG. 6C

FIG. 8C    Switch Actuation Legend →

S10 – phase 0
S11 – phase 8
S12 – phases 2, 6
S13 – phases 3, 5
S14 – phases 5, 7
S15 – phases 1, 3
S16 – phase 4
S17 – phases 1, 2
S18 – phases 6, 7

FIG. 9A
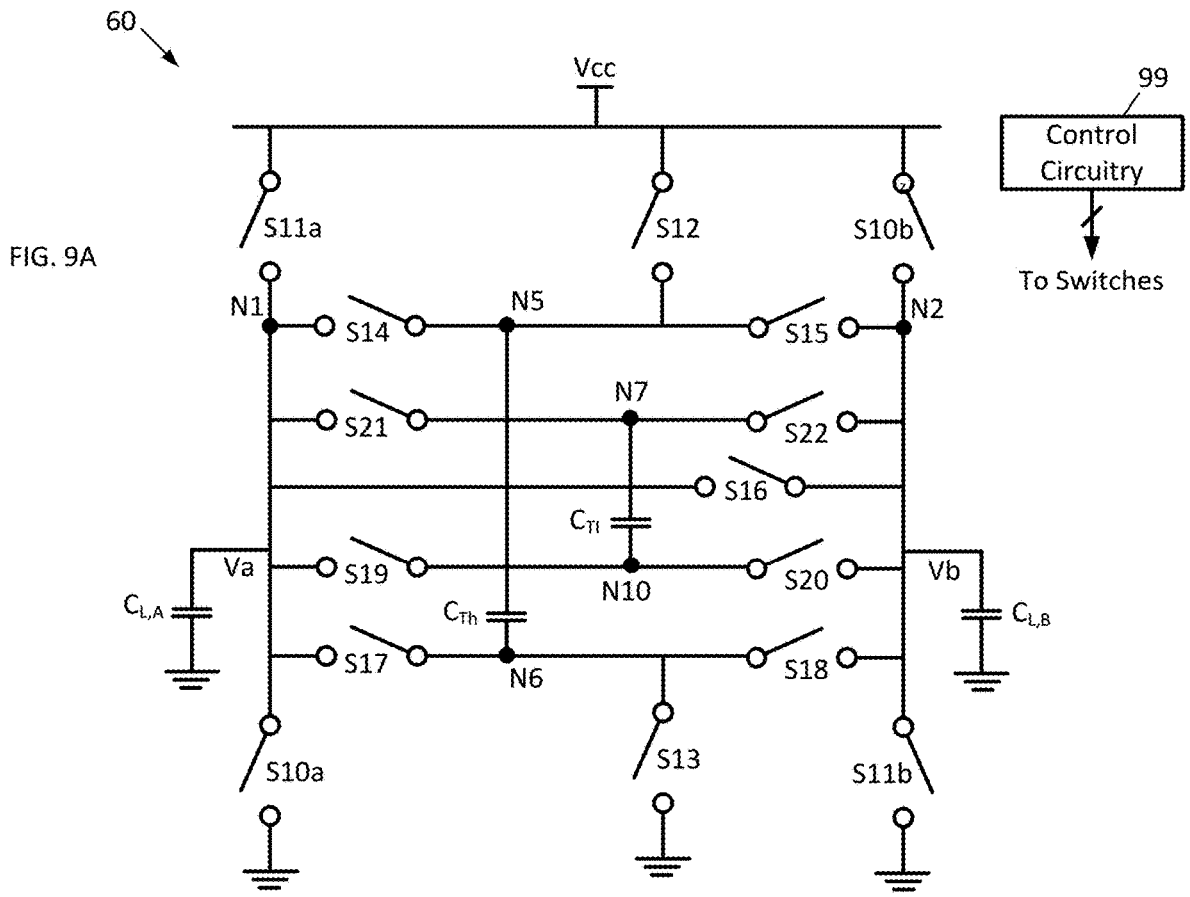
FIG. 9B
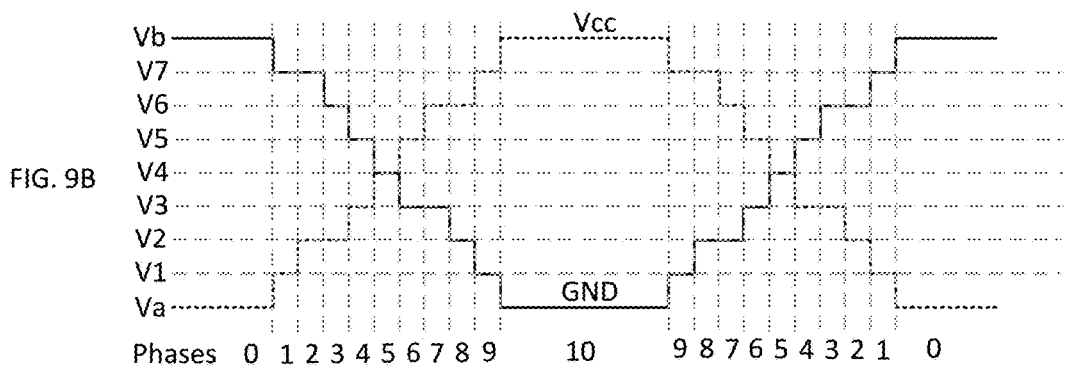
FIG. 9C  Switch Actuation Legend
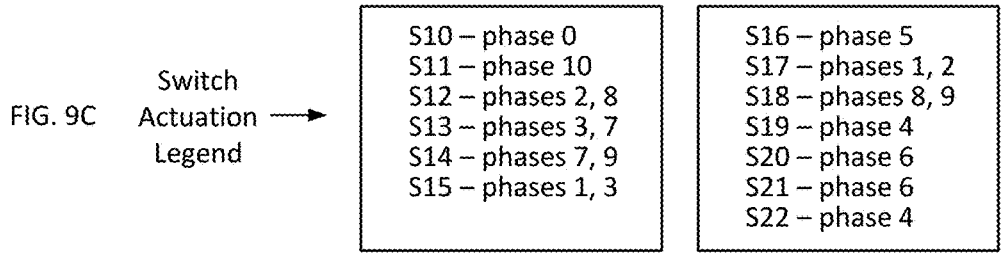

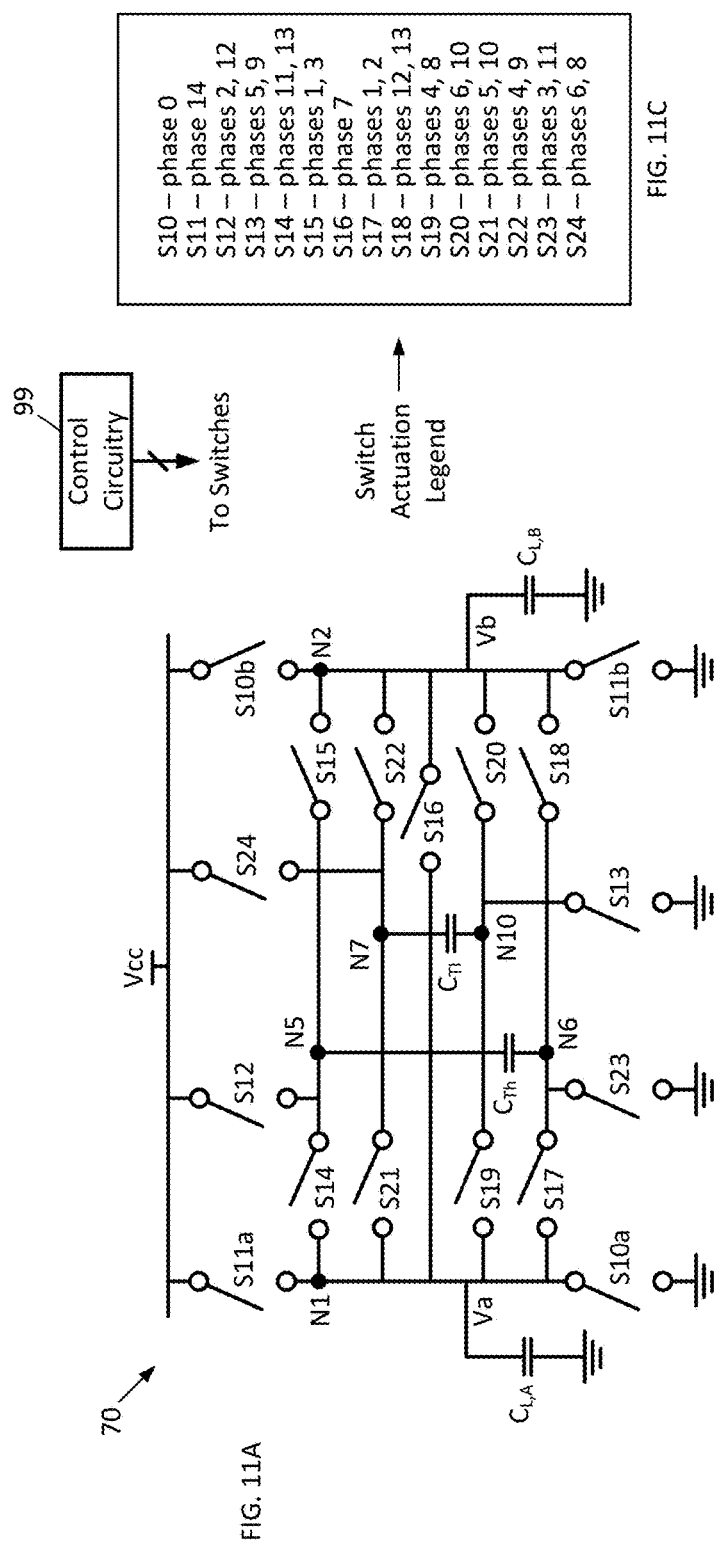
FIG. 11A
FIG. 11C
Switch Actuation Legend
S10 – phase 0
S11 – phase 14
S12 – phases 2, 12
S13 – phases 5, 9
S14 – phases 11, 13
S15 – phases 1, 3
S16 – phase 7
S17 – phases 1, 2
S18 – phases 12, 13
S19 – phases 4, 8
S20 – phases 6, 10
S21 – phases 5, 10
S22 – phases 4, 9
S23 – phases 3, 11
S24 – phases 6, 8
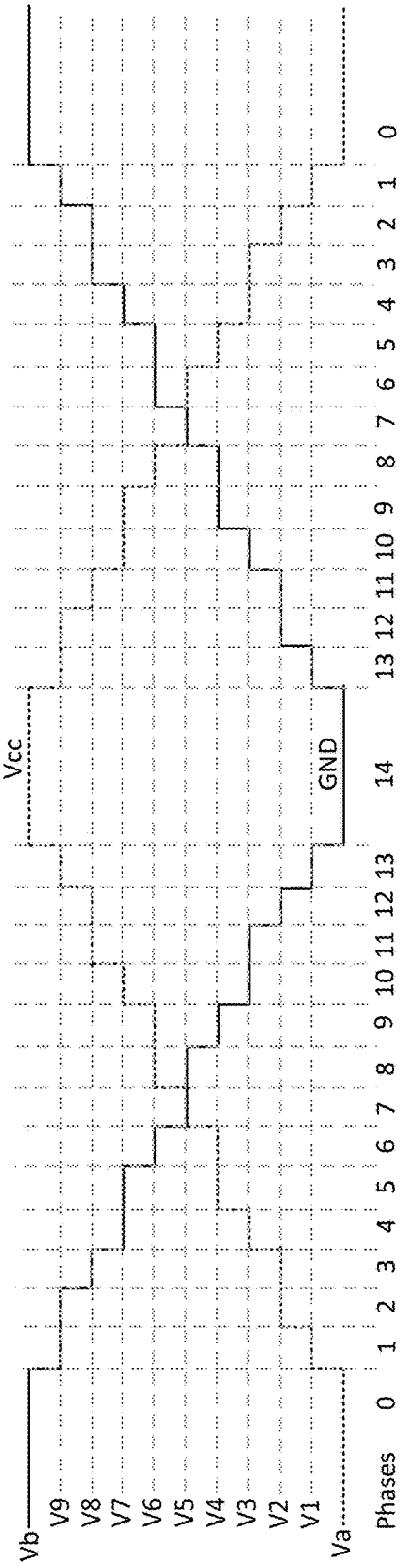
FIG. 11B

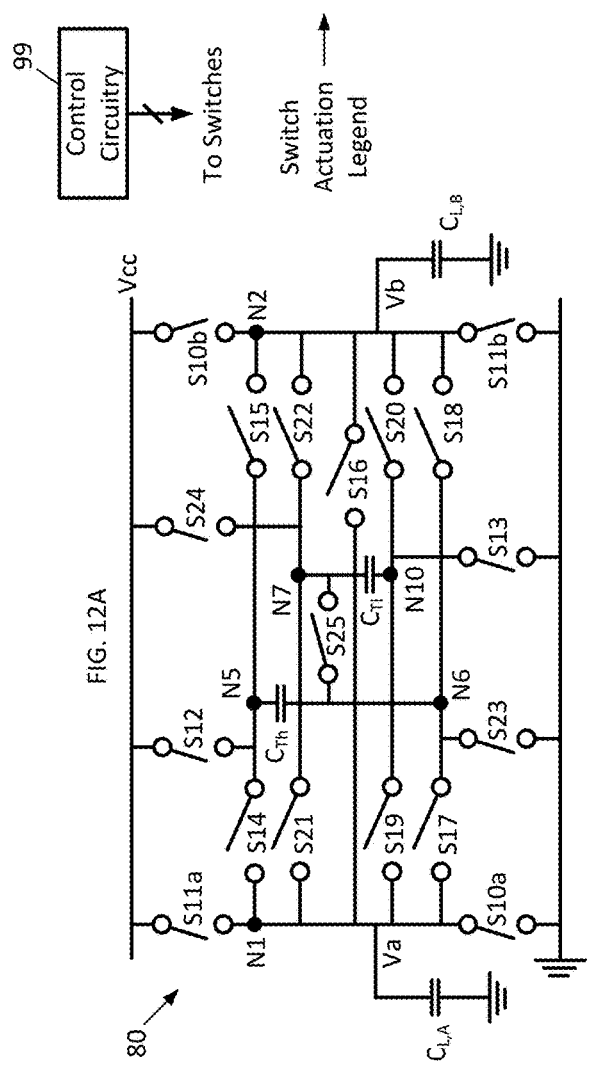
FIG. 12A
FIG. 12C
S10 – phase 0
S11 – phase 20
S12 – phases 2, 8, 12, 18
S13 – phases 3, 5, 15, 17
S14 – phases 11, 16, 17, 19
S15 – phases 1, 3, 4, 9
S16 – phase 10
S17 – phases 4, 8
S18 – phases 12, 16
S19 – phases 1, 2, 7, 14
S20 – phases 6, 13, 18, 19
S21 – phases 5, 13
S22 – phases 7, 15
S23 – phases 9, 11
S24 – phases 6, 14
S25 – phases 1, 2, 3, 17, 18, 19
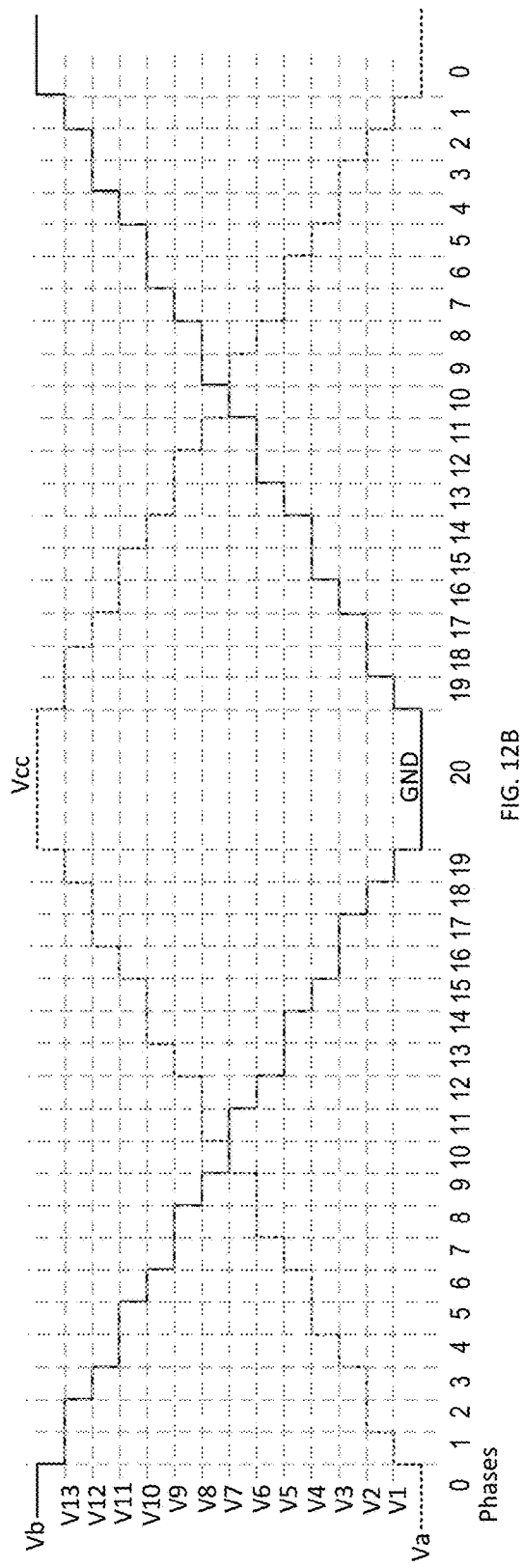
FIG. 12B

US 11,146,267 B1

CHARGE RECOVERY DRIVER FOR MEMS MIRROR WITH REDUCED NUMBER OF TANK CAPACITORS

TECHNICAL FIELD

This disclosure is related to a charge recovery circuit utilizing a reduced number of tank capacitors per supply voltage sub-levels as compared to prior designs, such as may be used in a driver for a microelectromechanical (MEMS) mirror.

BACKGROUND

Limitation of power dissipation within electronic circuitry is involved in design considerations of numerous applications. For example, power dissipation provides a measure of the efficiency of the system. The efficiency of the system impacts the design of the power supply for the system. That is, low efficiency leads to higher costs due to the waste of energy and the need for larger power supplies. This is of particular concern in battery powered systems, such as modern augmented reality and virtual reality glasses, and depth sensors for use in augmented reality systems, as well as portable picoprojectors, where it is desired for the device to operate on battery power for as long as possible between recharge cycles, and where it is nevertheless desired for the device to remain light and thin, meaning that the inclusion of a particularly large battery is often not an option.

Consider power dissipation when charging a load that may be modeled as a capacitor C1. Shown in FIG. 1A is a simple system 1 in which a switch Sw selectively connects a load capacitor C1 to a supply voltage V. Consider that the switch Sw (likely a MOSFET) has an on-resistance, that the capacitor C1 is initially discharged, and that the voltage drop across the resistance of the switch Sw varies from an initial value of V (at the moment when the switch Sw is closed) to a final value of zero (once the capacitor C1 has been charged to the voltage V). Therefore, the average voltage drop traversed by the charge across the switch is V/2, provided the rate of charging the capacitor C1 is linear. Therefore, the energy dissipated in this single switch Sw case to charge the capacitor C1 from no charge to the voltage V would be $E=CV(V/2)=CV^2/2$. The discharge process can be thought about similarly, so a complete conventional charge-discharge cycle of this single switch system would dissipate energy equal to $E=CV^2$.

Now, consider the case of drivers for the microelectromechanical (MEMS) actuators used in the example systems described above (e.g., virtual reality, augmented reality, picoprojectors, depth sensors, etc.). A MEMS actuator may be modeled as a load capacitor, on the order of nanofarads. In order to drive such actuators, a pulsed voltage (e.g., a PWM signal) is utilized. Therefore, the power consumption when such a load capacitor is driven is equal to the capacitance multiplied by the frequency f of the drive signal, multiplied by the square of the voltage of the drive signal. Mathematically, this can be represented as $P=CV^2f$. As an example, with a load capacitor on the order of nanofarads, a drive frequency of tens of kilohertz, and a voltage on the order of 20 to 40 volts, the power dissipation can be on the order of several hundred milliwatts, which is higher than desirable for use in a portable electronic device.

For such MEMS applications, typically the frequency of the drive signal is fixed at the resonant frequency of the MEMS actuator, the capacitance is based on the design of the actuator, and the voltage is also based on the design of the actuator and the mechanical movement it is intended to endure. Therefore, it may be difficult to reduce power consumption by changing the design of the actuator and its drive signal. Instead, other techniques may be used.

For example, "charge recovery" drivers for MEMS actuators have been developed. In simple terms, a charge recovery driver utilizes one or more tank capacitors to provide charge to the load capacitor (actuator) during one edge of the drive signal (e.g., the rising edge), and then during the next edge (e.g., the falling edge) when the capacitor is to discharge, the charge recovery driver tries to recover this charge which would otherwise be lost by transferring it back to the tank capacitors. Therefore, the charge recovery driver seeks to store the charge dissipated from the capacitor at one edge, and to then reuse that charge at the next edge.

There are, however, two limitations to such charge recovery drivers. First, when the load capacitor is to discharge, it is to be fully discharged to ground, so it is not possible to recover all charge from the load capacitor. Second, unavoidable power dissipation occurs within the switches used in the charge recovery operation in such charge recovery drivers.

Consider now if the load capacitor were to be charged in N steps so that each step is V/N high. In that case, the energy dissipation per step would be represented as $E_{step}=(CV/N)(V/2N)=CV^2/2N^2$. Therefore, to fully charge the capacitor in N steps, we would get $E_{stepwise}=N*E_{step}=N(CV/N)(V/2N)=CV^2/2N$, and for a full charge-discharge cycle, we would get $E_{stepwise}=CV^2/N$. As such, when operating at a frequency f, the power dissipation is $CV^2f/N$; it can then be reduced by a factor of N, with N being the number of steps used for charge/discharge.

Therefore, charge recovery drivers have been developed which charge and discharge capacitive loads in a stepwise fashion. One such known prior art charge recovery driver is shown in U.S. Pat. No. RE37552, wherein FIG. 3 of RE37552 is reproduced as FIG. 1B of this disclosure. Here, the charge recovery driver 5 drives a capacitive load C1. A supply voltage V is selectively connected to the load C1 by a switch Swn, and the load C1 may be selectively shorted to ground by a reset switch Sw0. A bank of tank capacitors Ctn-1, . . . , Ct1 (each of which have a capacitance that is an order of magnitude greater than that of the load C1) are selectively connected by switches Swn-1, . . . , Sw1 to the load C1.

In an initial standby condition, switch Sw0 is closed and there is no charge on the tank capacitors Ctn-1, . . . , Ct1. When an input pulse is to be transferred to the load C1, switch Sw0 is opened and Swn is closed. Since there is no charge on the load C1 nor on any of the tank capacitors Ctn-1, . . . , Ct1 at this point, there will be no charge transfer through any of the switches Swn-1, . . . , Sw1 as each is momentarily closed, in the order Sw1, . . . , Swn-1. When the switch Swn is closed, a charge is applied to the load C1. On the trailing edge of input pulse, a discharge cycle is initiated by when the switches Swn-1, . . . , Sw1 are momentarily closed in reverse order. Thus, switch Swn is opened and switch Swn-1 closed. Then switch Swn-1 is opened and switch Sw2 is closed, etc. On the closure of switch Swn-1, the associated tank capacitor Ctn-1 will receive most of the charge on the load capacitance C1. Each capacitor down the line will receive a lower charge than the immediately preceding capacitor. After switch Sw1 opens, switch Sw0 closes to complete the cycle dumping or discharging the remaining charge on the load C1 to ground.

Thus, over several cycles the tank capacitors will approach their steady state voltages. For example, the tank capacitors Ctn-1, . . . , Ct1 may have charges of, for example, 5, 4, 3, 2 and 1 volt respectively. Then, at the beginning of the next cycle, on the closure of the switch Sw1, the voltage on the tank capacitor Ct1 is applied to the load C1, then the voltage on the capacitor Ct2 is applied to the load and, so on. Thus, in the example, first 1 volt is applied to the load, then 2 volts, then 3 volts, etc. As a result, the voltage on the load C1 will gradually increase.

To discharge the load capacitance, switches Swn−1, . . . , Sw1 are closed and opened in succession, before finally switch Sw0 is closed. Therefore, during the discharge, each tank capacitor Ctn−1, . . . , Ct1 receives a charge of approximately the same amount as it delivered during the charge phase.

Without charge recovery, the theoretical power dissipation in this system would be $P=CV^2f$, where C=C1, V=the supply voltage, and f=the switching frequency. However, with N-step charge recovery, for the reasons explained above in detail, the theoretical system power dissipation is $P=(CV^2f)/N$.

While the system 5 of FIG. 1B is quite useful, it requires M=N−1 tank capacitors to produce N voltage sub-steps. Since tank capacitors are large and consume area, this design may not be desirable in some applications, as it would be more desirable to achieve N voltage sub-steps but with the number of M tank capacitors being less than N. As such, further development in to this area is needed.

SUMMARY

Disclosed herein is a charge recovery driver for a pair of loads, including: a first tank capacitor having a first terminal, and having a second terminal coupled to ground; a second tank capacitor having a first terminal, and having a second terminal coupled to ground; first and second output nodes coupled to the pair of loads; a first switch circuit configured to selectively couple the first terminal of the first tank capacitor to the first and/or second output nodes; a second switch circuit configured to selectively couple the first and second output nodes to one another; a third switch circuit configured to selectively couple the first terminal of the second tank capacitor to the first and/or second output nodes; a fourth switch circuit configured to selectively couple the first output node between a supply voltage and/or ground; a fifth switch circuit configured to selectively couple the second output node between the supply voltage and/or ground; and control circuitry. The control circuitry is configured to: a) cause the fourth switch circuit to couple the first output node to ground and cause the fifth switch circuit to couple the second output node to the supply voltage, during an initial phase; b) cause the first switch circuit to couple the first output node to the first terminal of the first tank capacitor and cause the third switch circuit to couple the second output node to the first terminal of the second tank capacitor, during a first phase; c) cause the second switch circuit to couple the first and second output nodes to one another, during a second phase; d) cause the first switch circuit to couple the second output node to the first terminal of the first tank capacitor and cause the third switch circuit to couple the first output node to the first terminal of the second tank capacitor, during a third phase; e) cause the fourth switch circuit to couple the first output node to the supply voltage and the fifth switch circuit to couple the second output node to ground, during a fourth phase; and perform d), c), b), and a).

Another charge recovery driver for a pair of loads is disclosed herein and includes: a tank capacitor having first and second terminals; first and second output nodes coupled to the pair of loads; a first switch circuit configured to selectively couple the second terminal of the tank capacitor to the first and/or second output nodes; a second switch circuit configured to selectively couple the first and second output nodes to one another; a third switch circuit configured to selectively couple the first terminal of the tank capacitor to the first and/or second output nodes; a fourth switch circuit configured to selectively couple the first output node between a supply voltage and/or ground; a fifth switch circuit configured to selectively couple the second output node between the supply voltage and/or ground; and control circuitry. The control circuitry is configured to: a) cause the fourth switch circuit to couple the first output node to ground and to cause the fifth switch circuit to couple the second output node to the supply voltage, during an initial phase; b) cause the third switch circuit to couple the first terminal of the tank capacitor to the second output node and the first switch circuit to couple the second terminal of the tank capacitor to the first output node, during a first phase; c) cause the second switch circuit to couple the first and second output nodes to one another, during a second phase; d) cause the third switch circuit to couple the first terminal of the tank capacitor to the first output node and the first switch circuit to couple the second terminal of the tank capacitor to the second output node, during a third phase; e) cause the fourth switch circuit to couple the first output node to the supply voltage and the fifth switch circuit to couple the second output node to ground, during a fourth phase; and perform d), c), b), and a).

Also disclosed herein is a charge recovery driver for a pair of loads, including: a first tank capacitor having first and second terminals; a second tank capacitor having first and second terminals; first and second output nodes coupled to the pair of loads; a first switch circuit configured to selectively couple the second terminal of the first tank capacitor to the first and/or second output nodes; a second switch circuit configured to selectively couple the second terminal of the second tank capacitor to the first and/or second output nodes; a third switch circuit configured to selectively couple the first and second output nodes to one another; a fourth switch circuit configured to selectively couple the first terminal of the second tank capacitor to the first and/or second output nodes; a fifth switch circuit configured to selectively couple the first terminal of the first tank capacitor to the first and/or second output nodes; a sixth switch circuit configured to selectively couple the first output node between a supply voltage and/or ground; a seventh switch circuit configured to selectively couple the second output node between the supply voltage and/or ground; and control circuitry. The control circuitry is configured to: a) cause the sixth switch circuit to couple the first output node to ground and cause the seventh switch circuit to couple the second output node to the supply voltage, during an initial phase; b) cause the first switch circuit to couple the second terminal of the first tank capacitor to the first output node and the fifth switch circuit to couple the first terminal of the first tank capacitor to the second output node, during a first phase; c) cause the second switch circuit to couple the second terminal of the second tank capacitor to the first output node and the fourth switch circuit to couple the first terminal of the second tank capacitor to the second output node, during a second phase; d) cause the third switch circuit to couple the first and second output nodes to one another, during a third phase; e) cause the fourth switch circuit to couple the first terminal of the second tank capacitor to the first output node and the second switch circuit to couple the second terminal of the second tank capacitor to the second output node, during a fourth phase; f) cause the fifth switch circuit to couple the first terminal of the first tank capacitor to the first output node and the first switch circuit to couple the second terminal of the first tank capacitor to the second output node, during a fifth phase; g) cause the sixth switch circuit to couple the first output node to the supply voltage and the seventh switch circuit to couple the second output node to ground, during a sixth phase; and perform f), e), d), c), b), and a).

Another charge recovery driver for a pair of loads is disclosed herein and includes: a tank capacitor having first and second terminals; first and second output nodes coupled to the pair of loads; a first switch circuit configured to selectively couple the second terminal of the tank capacitor to a first output node and/or a second output node; a second switch circuit configured to selectively couple the first and second output nodes to one another; a third switch circuit configured to selectively couple the first terminal of the tank capacitor to the first output node and/or the second output node; a fourth switch circuit configured to selectively couple the second terminal of the tank capacitor to ground; a fifth switch circuit configured to selectively couple the first terminal of the tank capacitor to a supply voltage; a sixth switch circuit configured to selectively couple the first output node between the supply voltage and/or ground; a seventh switch circuit configured to selectively couple the second output node between the supply voltage and/or ground; and control circuitry. The control circuitry is configured to: a) cause the sixth switch circuit to couple the first output node to ground and cause the seventh switch circuit to couple the second output node to the supply voltage, during an initial phase; b) cause the first switch circuit to couple the second terminal of the tank capacitor to the first output node and the third switch circuit to couple the first terminal of the tank capacitor to the second output node, during a first phase; c) cause the first switch circuit to couple the second terminal of the tank capacitor to the first output node and the fifth switch circuit to couple the first terminal of the tank capacitor to the supply voltage, during a second phase, while allowing the second output node to float; d) cause the third switch circuit to couple the first terminal of the tank capacitor to the second output node and the fourth switch circuit to couple the second terminal of the tank capacitor to ground, during a third phase, while allowing the first output node to float; e) cause the second switch circuit to couple the first and second output nodes to one another, during a fourth phase; f) cause the third switch circuit to couple the first terminal of the tank capacitor to the first output node and the fourth switch circuit to couple the second terminal of the tank capacitor to ground, during a fifth phase, while allowing the second output node to float; g) cause the first switch circuit to couple the second terminal of the tank capacitor to the second output node and the fifth switch circuit to couple the first terminal of the tank capacitor to the supply voltage, during a sixth phase, while allowing the first output node to float; h) cause the first switch circuit to couple the second terminal of the tank capacitor to the second output node and the third switch circuit to couple the first terminal of the tank capacitor to the first output node, during a seventh phase; i) cause the sixth switch circuit to couple the first output node to the supply voltage and cause the seventh switch circuit to couple the second output node to ground; and perform h), g), f), e), d), c), b), and a).

BRIEF DESCRIPTION OF THE DRAWINGS

FIG. 2A shows a prior art charge recovery driver for a pair of loads that are modeled as a couple of capacitors, disclosed herein.

FIG. 2B is a graph showing the voltage at the load capacitors of the charge recovery driver of FIG. 2A during operation.

FIG. 2C is a timing diagram showing the states of the switches of the charge recovery driver of FIG. 2A during operation.

FIG. 3A shows a first improved charge recovery driver for a pair of loads that are modeled as a couple of capacitors, disclosed herein.

FIG. 3B is a graph showing the voltage at the load capacitors of the charge recovery driver of FIG. 3A during operation.

FIG. 3C is a timing diagram showing the states of the switches of the charge recovery driver of FIG. 3A during operation.

FIG. 4A shows a second improved charge recovery driver for a pair of loads that are modeled as a couple of capacitors, disclosed herein.

FIG. 4B is a graph showing the voltage at the load capacitors of the charge recovery driver of FIG. 4A during operation.

FIG. 4C is a timing diagram showing the states of the switches of the charge recovery driver of FIG. 4A during operation.

FIG. 5A shows the current flow through the first improved charge recovery driver of FIG. 3A during the first phase of operation.

FIG. 5B shows the current flow through the second improved charge recovery driver of FIG. 4A during a first phase of operation.

FIG. 6A shows an expansion of the concept of the second improved charge recovery driver to utilize six voltage steps.

FIG. 6B is a graph showing the voltage at the load capacitors of the charge recovery driver of FIG. 6A during operation.

FIG. 6C is a timing diagram showing the states of the switches of the charge recovery driver of FIG. 6A during operation.

FIG. 8C is a switch actuation legend showing which switches of the charge recovery driver of FIG. 8A are closed during what operating phases.

FIG. 9A shows an expansion of the concept of the third improved charge recovery driver to utilize eight steps.

FIG. 9B is a graph showing the voltage at the load capacitors of the charge recovery driver of FIG. 9A during operation.

FIG. 9C is a switch actuation legend showing which switches of the charge recovery driver of FIG. 9A are closed during what operating phases.

FIG. 11A shows an expansion of the concept of the third improved charge recovery driver to utilize ten steps.

FIG. 11B is a graph showing the voltage at the load capacitors of the charge recovery driver of FIG. 11A during operation.

FIG. 11C is a switch actuation legend showing which switches of the charge recovery driver of FIG. 11A are closed during what operating phases.

FIG. 12A shows an expansion of the concept of the third improved charge recovery driver to utilize fourteen steps.

FIG. 12B is a graph showing the voltage at the load capacitors of the charge recovery driver of FIG. 12A during operation.

FIG. 12C is a switch actuation legend showing which switches of the charge recovery driver of FIG. 12A are closed during what operating phases.

DETAILED DESCRIPTION

Figure 1A:
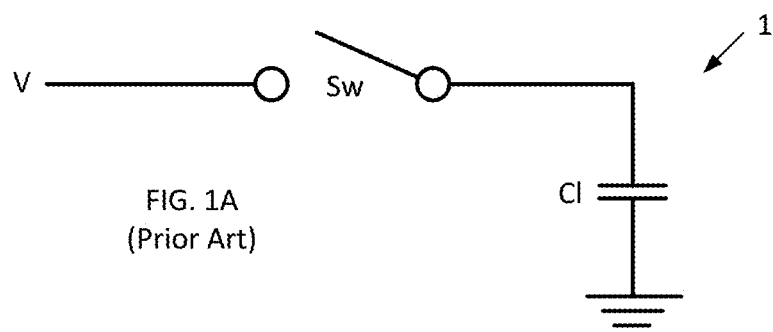
FIG. 1A shows a prior art driver for a load that is modeled as a capacitor.
Figure 1B:
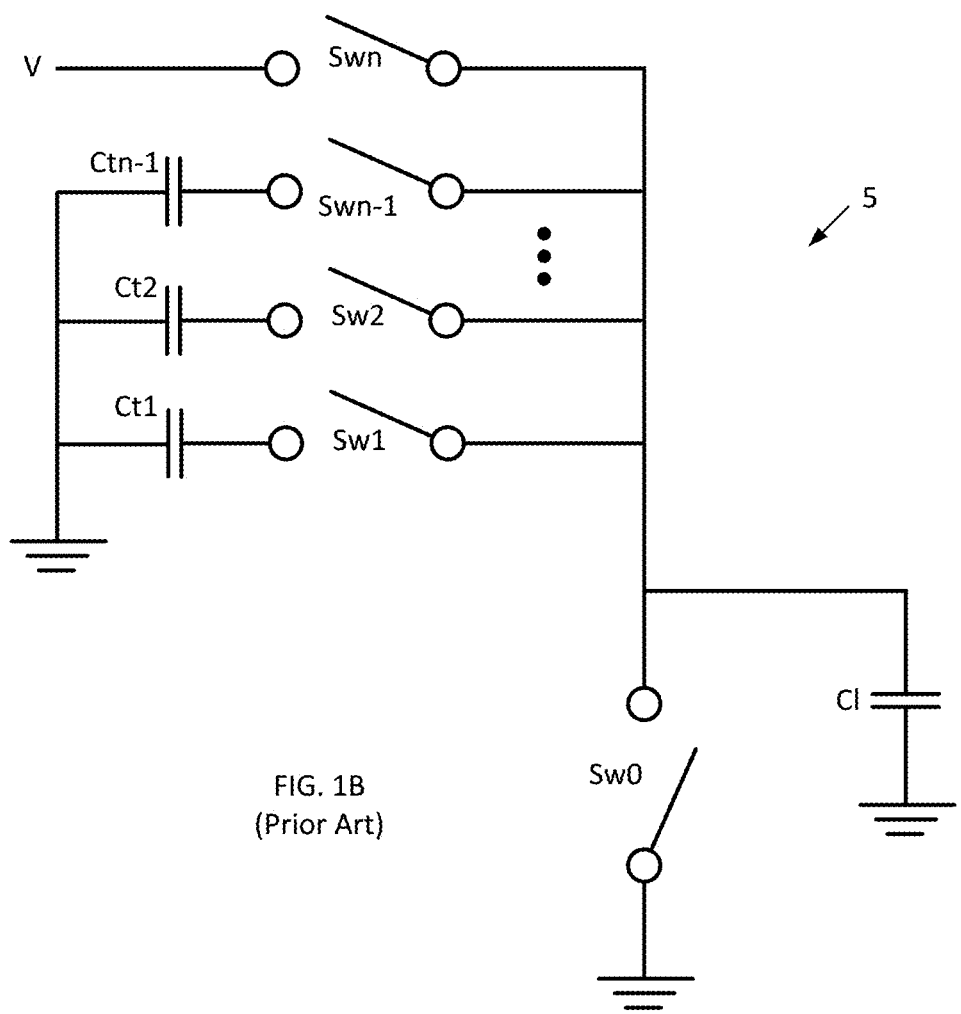
FIG. 1B shows a prior art charge recovery driver for a load that is modeled as a capacitor.

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

As an initial matter, note that each of the charge recovery drivers described below include control circuitry 99 that generates control signals for the switches of those charge recovery drivers to provide for the operations described below.

Now described with reference to FIG. 2A is a charge recovery driver 10 where the load (e.g., actuator for a MEMS device) is represented as load capacitors $C_{L,A}$ and $C_{L,B}$. The load capacitor $C_{L,A}$ is connected between node N1 and ground. A switch S0a is connected between node N1 and ground, while a switch S4a is connected between a supply voltage Vcc and node N1. The load capacitor $C_{L,B}$ is connected between node N2 and ground. A switch S4b is connected between node N2 and ground, while a switch S0b is connected between node N2 and Vcc.

A switch S3a is connected between nodes N1 and N5, and a switch S1b is connected between nodes N5 and N2. A switch S2a is connected between nodes N1 and N4, and a switch S2b is connected between nodes N4 and N2. A switch Sla is connected between nodes N1 and N3, and a switch S3b is connected between nodes N3 and N2.

A first tank capacitor $C_{T1}$ is connected between node N3 and ground. A second tank capacitor $C_{T2}$ is connected between node N4 and ground. A third tank capacitor $C_{T3}$ is connected between node N5 and ground. The tank capacitors may be off-chip discrete components.

With additional reference to FIGS. 2B-2C, the operation of the charge recovery driver 10 is now described. Appreciate that the design means that the charge on one load capacitor $C_{L,A}$ is rising while the charge on the other load capacitor $C_{L,B}$ is falling, and vice versa, allowing for both load capacitors to share the same tank capacitors $C_{T1}$, $C_{T2}$, $C_{T3}$. Appreciate further that the operation will be described in phases, with each phase being long enough to achieve the complete charge transfer between tank capacitors and load capacitors and vice versa.

Initially, during Phase 0, switches S0a, S0b are closed, while the other switches are open, with the result being that node N1 is coupled to ground to discharge load capacitor $C_{L,A}$ and node N2 is coupled to Vcc to charge load capacitor $C_{L,B}$ to Vcc. This can be observed in FIG. 2B, where the voltage Vb at node N2 is at Vcc while the voltage Va at node N1 is at ground initially.

Next, during Phase 1, switches S0a, S0b open, while switches S1a, S1b close. This has the effect of coupling tank capacitor $C_{T1}$ to load capacitor $C_{L,A}$ and coupling tank capacitor $C_{T3}$ to load capacitor $C_{L,B}$. At this point, since the charge across load capacitor $C_{L,A}$ is ground, charge is shared between tank $C_{T1}$ and load capacitor $C_{L,A}$, thereby charging load capacitor $C_{L,A}$ to a first step voltage V1 (equal to Vcc/4); conversely, since the charge across load capacitor $C_{L,B}$ is Vcc, charge is shared between tank $C_{T3}$ and load capacitor $C_{L,B}$, thereby discharging load capacitor $C_{L,B}$ down to the third step voltage V3 (equal to 3Vcc/4).

Then during Phase 2, switches S1a, S1b open, while switches S2a, S2b close. This has the effect of coupling tank capacitor $C_{T2}$ to load capacitor $C_{L,A}$ and load capacitor $C_{L,B}$, which, due to charge sharing, results in both load capacitor $C_{L,A}$ and load capacitor $C_{L,B}$ being set to the second step voltage V2 (equal to 2Vcc/4).

During Phase 3, switches S2a, S2b open, while switches S3a, S3b close. This has the effect of coupling tank capacitor $C_{T3}$ to load capacitor $C_{L,A}$, and coupling tank capacitor $C_{T1}$ to load capacitor $C_{L,B}$. This has the effect of transferring charge from load capacitor $C_{L,B}$, to tank capacitor $C_{T1}$, thereby discharging load capacitor $C_{L,B}$ to the first step voltage V1 (equal to Vcc/4). This also has the effect of transferring charge from tank capacitor $C_{T3}$ to load capacitor $C_{L,A}$, thereby charging load capacitor $C_{L,A}$ to the third step voltage V3 (equal to 3Vcc/4).

During Phase 4, switches S3a, S3b open, while switches S4a, S4b close. This has the effect of coupling load capacitor $C_{L,A}$ to Vcc, and coupling load capacitor $C_{L,B}$ to ground. Therefore, here, load capacitor $C_{L,B}$ is discharged to ground and load capacitor $C_{L,A}$ is charged to Vcc.

It should be appreciated that the reverse transition on the load capacitors $C_{L,A}$ and $C_{L,B}$ is done when phases 3, 2, 1, and finally 0 are repeated, in that reverse order.

Therefore, now during a return to Phase 3, switch S4 opens, while switches S3a, S3a close. This has the effect of coupling tank capacitor $C_{T3}$ to load capacitor $C_{L,A}$, and coupling tank capacitor $C_{T1}$ to load capacitor $C_{L,B}$. As a result, charge is transferred from tank capacitor $C_{T1}$ to load capacitor $C_{L,B}$ to thereby charge load capacitor $C_{L,B}$ to the first step voltage V1 (equal to Vcc/4). Likewise, charge is transferred from load capacitor $C_{L,A}$ to the tank capacitor $C_{T3}$ to thereby discharge load capacitor $C_{L,A}$ to the third step voltage V3 (equal to 3Vcc/4).

Likewise, now during Phase 2, switches S3a, S3b open, while switches S2a, S2b close. This has the effect of coupling tank capacitor $C_{T2}$ to load capacitor $C_{L,A}$ and load capacitor $C_{L,B}$, which, due to charge sharing, results in both load capacitor $C_{L,A}$ and load capacitor $C_{L,B}$ being set to the second step voltage V2 (equal to 2Vcc/4).

Similarly, now during Phase 1, switches S2a, S2b open, while switches S1a, S1b close. This has the effect of coupling tank capacitor $C_{T1}$ to load capacitor $C_{L,A}$ and coupling tank capacitor $C_{T3}$ to load capacitor $C_{L,B}$. As a result, charge is transferred from tank capacitor $C_{T3}$ to load capacitor $C_{L,B}$ to thereby charge the load capacitor $C_{L,B}$ to the third step voltage V3 (equal to 3Vcc/4). Also, charge is transferred from load capacitor $C_{L,A}$ to tank capacitor $C_{T1}$ to discharge load capacitor $C_{L,A}$ to the first step voltage V1 (equal to Vcc/4).

Finally, we return to Phase 0, during which switches S1a, S1b open, while switches S0a, S0b closes. This has the effect of coupling load capacitor $C_{L,A}$ to ground, thereby discharging load capacitor $C_{L,A}$ to ground; conversely, this has the effect of coupling load capacitor $C_{L,B}$ to Vcc, thereby charging load capacitor $C_{L,B}$ to Vcc.

Therefore, a full cycle of operation of the charge recovery driver 10 has been described. As to power dissipation, if $C_{L,A}=C_{L,B}=C$, with N representing the number of voltage steps (here, there are four steps between ground and Vcc) then the power dissipation of this charge recovery driver 10 is $(2CV^2f)/N$, as opposed to the $2CV^2f$ of a solution without charge recovery. Thus, this charge recovery driver 10 has reduced power dissipation by a factor of N=4, using M=3 tank capacitors, and 2N+2=10 switches.

It is possible to improve on the charge recovery driver 10 design of FIG. 2A. In some designs where the load capacitors are to be driven with high voltages, for example 40 V, the tank capacitors are discrete devices that are not integrated on-chip with the remainder of the charge recovery driver due to the amount of charge they are to store. Therefore, for such applications it is desirable to reduce the number of tank capacitors without reducing the amount of reduction in power dissipation provided by the design. In addition, note that the switches (e.g., transistor) described hereinabove are high voltage devices, so it would be undesirable to increase the number of such switches since such switches consume a non-negligible amount of on-chip area, and since such switches themselves are responsible for a portion of power consumption within the charge recovery driver. In fact, due to this, a decrease in the number of switches would be desirable.

In prior art applications, the value of the charge recovery factor N, and then the amount of power dissipation reduction, is often limited by the maximum number M of external capacitors suitable in the application, being the two quantity bonded by relationship M=N−1. The purpose of this disclosure is to show how to obtain high values of the charge recovery factor N with a limited number of external capacitors M, in the case of driving a pair of loads; this is done also employing a number of switches in the same range as in a prior art configuration having same recovery factor N.

First Improved Embodiment

Provided that the number of voltage steps N is an even number, it is possible to remove the central tank capacitor $C_{T2}$ and instead short the load capacitors $C_{L,A}$ and $C_{L,B}$ together during phases in which they are to have equal voltage, as shown in FIG. 3A and now described. In the charge recovery driver 20 design of FIG. 3A, the load capacitor $C_{L,A}$ is connected between node N1 and ground. A switch S0a is connected between node N1 and ground, while a switch S4a is connected between a supply voltage Vcc and node N1. The load capacitor $C_{L,B}$ is connected between node N2 and ground. A switch S4b is connected between node N2 and ground, while a switch S0b is connected between node N2 and Vcc. Note that the tank capacitors may be discrete devices, and not integrated on-chip with the remainder of the charge recovery driver 20.

A switch S3a is connected between nodes N1 and N5, and a switch S1b is connected between nodes N5 and N2. A switch S2 is connected between nodes N1 and N2. A switch S1a is connected between nodes N1 and N3, and a switch S3b is connected between nodes N3 and N2. A first tank capacitor $C_{T1}$ is connected between node N3 and ground. A second tank capacitor $C_{T3}$ is connected between node N5 and ground.

Therefore, as compared to the charge recovery driver 10 of FIG. 2A, the charge recovery driver 20 of FIG. 3A has removed the tank capacitor $C_{T2}$ and has but one switch S2 instead of two S2a, S2b.

With additional reference to FIGS. 3B-3C, the operation of the charge recovery driver 20 is now described. Appreciate that the operation will be described in phases, with each phase being long enough to achieve the complete charge transfer between tank capacitors and load capacitors and vice versa. Initially during Phase 0, switches S0a, S0b are closed, while the other switches are open, with the result being that node N1 is coupled to ground to discharge load capacitor $C_{L,A}$ to ground and node N2 is coupled to Vcc to charge load capacitor $C_{L,B}$ to Vcc. This can be observed in FIG. 3B, where the voltage Vb at node N2 is at Vcc while the voltage Va at node N1 is at ground initially.

Next, during Phase 1, switches S0a, S0b open, while switches S1a, S1b close. This has the effect of coupling tank capacitor $C_{T1}$ to load capacitor $C_{L,A}$ and coupling tank capacitor $C_{T3}$ to load capacitor $C_{L,B}$. At this point, since the charge across load capacitor $C_{L,A}$ is ground, charge is shared between tank $C_{T1}$ and load capacitor $C_{L,A}$, thereby charging load capacitor $C_{L,A}$ to a first step voltage V1 (equal to Vcc/4); conversely, since the charge across load capacitor $C_{L,B}$ is Vcc, charge is shared between tank $C_{T3}$ and load capacitor $C_{L,B}$, thereby discharging load capacitor $C_{L,B}$ down to the third step voltage V3 (equal to 3Vcc/4). It can be verified that the voltage value Vcc/4 for capacitor $C_{T1}$ and the voltage value 3Vcc/4 for capacitor $C_{T3}$ are the steady-state values that the system automatically reaches after some working time even if starting from different values of the charges on the tank capacitors $C_{T1}$ and $C_{T3}$.

Then during Phase 2, switches S1a, S1b open, while switch S2 closes. This has the effect of coupling load capacitor $C_{L,A}$ to load capacitor $C_{L,B}$, which, due to charge sharing, results in both load capacitor $C_{L,A}$ and load capacitor $C_{L,B}$ being set to the second step voltage V2 (equal to 2Vcc/4). Thus, here, the discharge current from load capacitor $C_{L,B}$ flows to load capacitor $C_{L,A}$ without the need for storing that charge in and discharging that charge from a tank capacitor.

During Phase 3, switch S2 opens, while switches S3a, S3b close. This has the effect of coupling tank capacitor $C_{T3}$ to load capacitor $C_{L,A}$, and coupling tank capacitor $C_{T1}$ to load capacitor $C_{L,B}$. This has the effect of transferring charge from load capacitor $C_{L,B}$, to tank capacitor $C_{T1}$, thereby discharging load capacitor $C_{L,B}$ to the first step voltage V1 (equal to Vcc/4). This also has the effect of transferring charge from tank capacitor $C_{T3}$ to load capacitor $C_{L,A}$, thereby charging load capacitor $C_{L,A}$ to the third step voltage V3 (equal to 3Vcc/4).

During Phase 4, switches S3a, S3b open, while switches S4a, S4b close. This has the effect of coupling load capacitor $C_{L,A}$ to Vcc, and coupling load capacitor $C_{L,B}$ to ground. Therefore, here, load capacitor $C_{L,B}$ is discharged to ground and load capacitor $C_{L,A}$ is charged to Vcc.

It should be appreciated that the reverse transition on the load capacitors $C_{L,A}$ and $C_{L,B}$ is done when, phases 3, 2, 1, and finally 0 are repeated, in that reverse order.

So, now, back at Phase 3, switches S4a, S4b open, while switches S3a, S3b close. This has the effect of coupling tank capacitor $C_{T3}$ to load capacitor $C_{L,A}$, and coupling tank capacitor $C_{T1}$ to load capacitor $C_{L,B}$. As a result, charge is transferred from tank capacitor $C_{T1}$ to load capacitor $C_{L,B}$ to thereby charge load capacitor $C_{L,B}$ to the first step voltage V1 (equal to Vcc/4). Likewise, charge is transferred from load capacitor $C_{L,A}$ to the tank capacitor $C_{T3}$ to thereby discharge load capacitor $C_{L,A}$ to the third step voltage V3 (equal to 3Vcc/4).

Back at Phase 2, switches S3a, S3b open, while switch S2 closes. This has the effect of coupling load capacitor $C_{L,A}$ to load capacitor $C_{L,B}$, which, due to charge sharing, results in both load capacitor $C_{L,A}$ and load capacitor $C_{L,B}$ being set to the second step voltage V2 (equal to 2Vcc/4). Thus, here, the discharge current from load capacitor $C_{L,A}$ flows to load capacitor $C_{L,B}$, without the need for storing that charge in and discharging that charge from a tank capacitor.

Back at Phase 1, switch S2 opens, while switches S1a, S1b close. This has the effect of coupling tank capacitor $C_{T1}$ to load capacitor $C_{L,A}$, and coupling tank capacitor $C_{T3}$ to load capacitor $C_{L,B}$. As a result, charge is transferred from tank capacitor $C_{T3}$ to load capacitor $C_{L,B}$ to thereby charge the load capacitor $C_{L,B}$ to the third step voltage V3 (equal to 3Vcc/4). Also, charge is transferred from load capacitor $C_{L,A}$ to tank capacitor $C_{T1}$ to discharge load capacitor $C_{L,A}$ to the first step voltage V1 (equal to Vcc/4).

Finally, upon a return to Phase 0, switches S1a, S1b open, while switches S0a, S0b closes. This has the effect of coupling load capacitor $C_{L,A}$ to ground, thereby discharging load capacitor $C_{L,A}$ to ground; conversely, this has the effect of coupling load capacitor $C_{L,B}$ to Vcc, thereby charging load capacitor $C_{L,B}$ to Vcc.

Therefore, a full cycle of operation of the charge recovery driver 20 has been described. As to power dissipation, if $C_{L,A}=C_{L,B}=C$, with N representing the number of voltage steps (here, there are four steps between ground and Vcc) then the power dissipation of this charge recovery driver 20 is $(2CV^2f)/N$, as opposed to the $2CV^2f$ of a solution without charge recovery. Thus, this charge recovery driver 20 has reduced power dissipation by a factor of N=4, using M=2 tank capacitors, and 2N+1=9 switches, thereby reducing the number of external capacitors and the on-chip area consumption as compared to the design of FIG. 2A (which uses 3 tank capacitors and 10 switches).

Second Improved Embodiment

As compared to the design of FIG. 3A, it is possible to remove the grounded tank capacitors $C_{T1}$, $C_{T3}$ and replace them with a single floating capacitor $C_{T13}$, as shown in FIG. 4A and now described. Therefore, note that the single floating capacitor CT13 is to be coupled to nodes symmetrical with respect to the mid-point between the supply voltage Vcc and ground.

In the charge recovery driver 30 design of FIG. 4A, the load capacitor $C_{L,A}$ is connected between node N1 and ground. A switch S0a is connected between node N1 and ground, while a switch S4a is connected between a supply voltage Vcc and node N1. The load capacitor $C_{L,B}$ is connected between node N2 and ground. A switch S4b is connected between node N2 and ground, while a switch S0b is connected between node N2 and Vcc. Note that the tank capacitors may be discrete devices, and not integrated on-chip with the remainder of the charge recovery driver 30.

A switch S3a is connected between nodes N1 and N5, and a switch S1b is connected between nodes N5 and N2. A switch S2 is connected between nodes N1 and N2. A switch S1a is connected between nodes N1 and N6, and a switch S3b is connected between nodes N6 and N2. A tank capacitor $C_{T13}$ is connected between nodes N5 and N6.

Therefore, as compared to the charge recovery driver 20 of FIG. 3A, the charge recovery driver 30 of FIG. 4A has replaced the tank capacitors $C_{T1}$ and $C_{T3}$. Note also that the tank capacitor $C_{T13}$, unlike the tank capacitors $C_{T1}$ and $C_{T3}$ of FIG. 3A, does not have a terminal that is directly electrically connected to ground.

With additional reference to FIGS. 4B-4C, the operation of the charge recovery driver 30 is now described. Appreciate that the operation will be described in phases, with each phase being long enough to achieve the complete charge transfer between tank capacitors and load capacitors and vice versa. Initially, during Phase 0, switches S0a, S0b are closed, while the other switches are open, with the result being that node N1 is coupled to ground to discharge load capacitor $C_{L,A}$ to ground, and node N2 is coupled to Vcc to charge load capacitor $C_{L,B}$ to Vcc. This can be observed in FIG. 4B, where the voltage Vb at node N2 is at Vcc while the voltage Va at node N1 is at ground initially.

Next, during Phase 1, switches S0a, S0b open, while switches S1a, S1b close. This has the effect of coupling tank capacitor $C_{T13}$ to load capacitor $C_{L,A}$ and load capacitor $C_{L,B}$. At this point, since the charge across load capacitor $C_{L,A}$ is ground, charge is shared between tank $C_{T13}$ and load capacitor $C_{L,A}$, thereby charging load capacitor $C_{L,A}$ to a first step voltage V1 (equal to Vcc/4); conversely, since the charge across load capacitor $C_{L,B}$ is Vcc, charge is shared between tank $C_{T13}$ and load capacitor $C_{L,B}$, thereby discharging load capacitor $C_{L,B}$ down to the third step voltage V3 (equal to 3Vcc/4). Note here that the reason that the load capacitors $C_{L,A}$ and $C_{L,B}$ do not end up being charged/discharged to the same voltage level at this step is that the tank capacitor $C_{T13}$ is charged at a voltage, in this case of N=4, equal to 2Vcc/4. It can be verified that this voltage value for capacitor $C_{T13}$ is the steady-state value that the system automatically reaches after some working time even if starting from a different value of $C_{T13}$ charge.

At Phase 2, switches S1a, S1b open, while switch S2 closes. This has the effect of coupling load capacitor $C_{L,A}$ to load capacitor $C_{L,B}$, which, due to charge sharing, results in both load capacitor $C_{L,A}$ and load capacitor $C_{L,B}$ being set to the second step voltage V2 (equal to 2Vcc/4). Thus, here, the discharge current from load capacitor $C_{L,B}$ flows to load capacitor $C_{L,A}$, without the need for storing that charge in and discharging that charge from a tank capacitor.

At Phase 3, switch S2 opens, while switches S3a, S3b close. This has the effect of coupling tank capacitor $C_{T13}$ to load capacitor $C_{L,A}$ and load capacitor $C_{L,B}$. This has the effect of transferring charge from load capacitor $C_{L,B}$, to tank capacitor $C_{T13}$, thereby discharging load capacitor $C_{L,B}$ to the first step voltage V1 (equal to Vcc/4). This also has the effect of transferring charge from tank capacitor $C_{T13}$ to load capacitor $C_{L,A}$, thereby charging load capacitor $C_{L,A}$ to the third step voltage V3 (equal to 3Vcc/4).

At Phase 4, switches S3a, S3b open, while switches S4a, S4b close. This has the effect of coupling load capacitor $C_{L,A}$ to Vcc, and coupling load capacitor $C_{L,B}$ to ground. Therefore, here, load capacitor $C_{L,B}$ is discharged to ground and load capacitor $C_{L,A}$ is charged to Vcc.

It should be appreciated that the reverse transition on the load capacitors $C_{L,A}$ and $C_{L,B}$ is done when phases 3, 2, 1, and finally 0 are repeated, in that reverse order.

At the return to Phase 3, switch S4 opens, while switches S3a, S3a close. This has the effect of coupling tank capacitor $C_{T13}$ to load capacitor $C_{L,A}$ and load capacitor $C_{L,B}$. As a result, charge is transferred from tank capacitor $C_{T13}$ to load capacitor $C_{L,B}$ to thereby charge load capacitor $C_{L,B}$ to the first step voltage V1 (equal to Vcc/4). Likewise, charge is transferred from load capacitor $C_{L,A}$ to the tank capacitor $C_{T3}$ to thereby discharge load capacitor $C_{L,A}$ to the third step voltage V3 (equal to 3Vcc/4).

At the return to Phase 2, switches S3a, S3b open, while switch S2 closes. This has the effect of coupling load capacitor $C_{L,A}$ to load capacitor $C_{L,B}$, which, due to charge sharing, results in both load capacitor $C_{L,A}$ and load capacitor $C_{L,B}$ being set to the second step voltage V2 (equal to 2Vcc/4). Thus, here, the discharge current from load capacitor $C_{L,A}$ flows to load capacitor $C_{L,B}$, without the need for storing that charge in and discharging that charge from a tank capacitor.

At the return to Phase 1, switch S2 opens, while switches S1a, S1b close. This has the effect of coupling tank capacitor $C_{T13}$ to load capacitor $C_{L,A}$ and to load capacitor $C_{L,B}$. As a result, charge is transferred from tank capacitor $C_{T13}$ to load capacitor $C_{L,B}$ to thereby charge the load capacitor $C_{L,B}$ to the third step voltage V3 (equal to 3Vcc/4). Also, charge is transferred from load capacitor $C_{L,A}$ to tank capacitor $C_{T13}$ to discharge load capacitor $C_{L,A}$ to the first step voltage V1 (equal to Vcc/4).

Finally, upon the return to Phase 0, switches S1a, S1b open, while switches S0a, S0b closes. This has the effect of coupling load capacitor $C_{L,A}$ to ground, thereby discharging load capacitor $C_{L,A}$ to ground; conversely, this has the effect of coupling load capacitor $C_{L,B}$ to Vcc, thereby charging load capacitor $C_{L,B}$ to Vcc.

Therefore, a full cycle of operation of the charge recovery driver 30 has been described. As to power dissipation, if $C_{L,A}=C=C$, with N representing the number of voltage steps (here, there are four steps between ground and Vcc) then the power dissipation of this charge recovery driver 30 is $(2CV^2f)/N$, as opposed to the $2CV^2f$ of a solution without charge recovery. Thus, this charge recovery driver 30 has reduced power dissipation by a factor of N=4, using M=1 tank capacitors, and 2N+1=9 switches, thereby reducing the number of external capacitors used as well as on-chip area consumption as compared to the design of FIG. 3A (which uses 2 tank capacitors and 9 switches).

Comparison of Charge Recovery Drivers of First and Second Improved Embodiments FIGS. 5A-5B illustrate the current flow equivalence of the charge recovery driver 20 and the charge recovery driver 30 during Phase 1, for example. As shown in FIG. 5A, in the charge recovery driver 20, during operation, as between the load capacitors $C_{L,A}$ and $C_{L,B}$, the current flows through switches S1b and S1a; similarly, as shown in FIG. 5B, in the charge recovery driver 30, during operation, as between the load capacitors $C_{L,A}$ and $C_{L,B}$, the current flows through switches S1b and S1a. Thus, it is evident that as to the voltages at the load capacitors $C_{L,A}$ and $C_{L,B}$, nothing has changed, as the current flows through the same switches, so the losses due to parasitics are the same, as is the power consumption.

Another observation that can be easily made when viewing FIGS. 5A and 5B is that if the ground connection of capacitors $CT_1$ and $CT_3$ in FIG. 5A is removed, the electrical layout of FIG. 5B results. Thus, tank capacitor $C_{T13}$ has a capacitance equal to the series of the capacitances of tank capacitors $C_{T1}$ and $C_{T3}$.

Understand, however, that $C_{T13}$ could actually have a capacitance equal to one half the capacitances of $C_{T1}$ and $C_{T3}$ and achieve equivalent dynamic characteristics at the output nodes N1 and N2. Stated another way, the voltage on the tank line changes a small amount at each output transition (and returns at the next opposite transition).

The amount of this voltage ripple can be calculated as $$\frac{C_L}{C_T + C_L} \cdot \frac{V}{N} \approx \frac{C_L}{C_T} \cdot \frac{V}{N}$$

for the design of FIG. 5A, where $C_T=C_{T1}=C_{T3}$, and can be calculated as $$\frac{C_L}{2C_T + C_L} \cdot \frac{V}{N} \approx \frac{C_L}{2C_T} \cdot \frac{V}{N}$$

for the design of FIG. 5B, where $C_T=C_{T13}$, and, in both cases, $C_L=C_{L,A}=C_{L,B}$. The equivalence of the two formulas happens when $2C_{T13}=C_{T1}=C_{T3}$.

Thus, the fact that $C_{T13}$ could actually have a capacitance equal to one half the capacitances of $C_{T1}$ and $C_{T3}$ and achieve equivalent dynamic characteristics at the output nodes N1 and N2 is confirmed.

Therefore, the ripple on the tank lines in the design of FIG. 5B is reduced by one half as compared to the design of FIG. 5A due to the tank capacitor $C_{T13}$ having a capacitance equal to the capacitances of tank capacitors $C_{T1}$ and $C_{T3}$. If, however, the tank capacitor $C_{T13}$ were to have a capacitance equal to one half the capacitances of tank capacitors $C_{T1}$ and $C_{T3}$, then the ripple on the tank lines in the design of FIG. 5B would be the same as in the design of FIG. 4A.

Expansion of Second Improved Embodiment to Utilize More Voltage Steps

The general concept to expand the concept of the charge recovery driver 30 of FIG. 4A to utilize more voltage steps is that for a given number of N voltage steps, the number of tank capacitors is equal to M=(N−2)/2. An example of this is now described with reference to the charge recovery driver 40 of FIG. 6A, which utilizes N=6 voltage steps. Notice here the use of two floating tank capacitors $C_{T15}$ and $C_{T24}$, which are coupled between nodes symmetrical with respect to the mid-point between the supply voltage Vcc and ground.

The load capacitor $C_{L,A}$ is connected between node N1 and ground. A switch S0a is connected between node N1 and ground, while a switch S6a is connected between a supply voltage Vcc and node N1. The load capacitor $C_{L,B}$ is connected between node N2 and ground. A switch S6b is connected between node N2 and ground, while a switch S0b is connected between node N2 and Vcc. Note that the tank capacitors may be discrete devices, and not integrated on-chip with the remainder of the charge recovery driver 40.

A switch S5a is connected between nodes N1 and N5, and a switch S1b is connected between nodes N5 and N2. A switch S4a is connected between nodes N1 and N7, and a switch S2b is connected between nodes N7 and N2. A switch S3 is connected between nodes N1 and N2. A switch S2a is connected between nodes N1 and N8, and a switch S4b is connected between nodes N8 and N2. A switch S1a is connected between nodes N1 and N6, and a switch S5b is connected between nodes N6 and N2.

A tank capacitor $C_{T15}$ is connected between nodes N5 and N6, and a tank capacitor $C_{T24}$ is connected between nodes N7 and N8.

Operation of the charge recovery driver 40 is now described with additional reference to FIGS. 6B-6C. Appreciate that the operation will be described in phases, with each phase being long enough to achieve the complete charge transfer between tank capacitors and load capacitors and vice versa. Initially, during Phase 0, switches S0a, S0b are closed, while the other switches are open, with the result being that node N1 is coupled to ground to discharge load capacitor $C_{L,A}$ and node N2 is coupled to Vcc to charge load capacitor $C_{L,B}$ to Vcc. This can be observed in FIG. 6B, where the voltage Vb at node N2 is at Vcc while the voltage Va at node N1 is at ground initially.

During Phase 1, switches S0a, S0b open, while switches S1a, S1b close. This has the effect of coupling tank capacitor $C_{T15}$ to load capacitor $C_{L,A}$ and load capacitor $C_{L,B}$. At this point, since the charge across load capacitor $C_{L,A}$ is ground, charge is shared between tank $C_{T15}$ and load capacitor $C_{L,A}$, thereby charging load capacitor $C_{L,A}$ to a first step voltage V1 (equal to Vcc/6); conversely, since the charge across load capacitor $C_{L,B}$ is Vcc, charge is shared between tank $C_{T15}$ and load capacitor $C_{L,B}$, thereby discharging load capacitor $C_{L,B}$ down to the fifth step voltage V5 (equal to 5Vcc/6). Note here that the reason that the load capacitors $C_{L,A}$ and $C_{L,B}$ do not end up being charged/discharged to the same voltage level at this step is that the capacitor $C_{T15}$ is charged at a voltage, in this case of N=6, equal to 4Vcc/6. It can be verified that this voltage value for capacitor $C_{T15}$ is the steady-state value that the system automatically reaches after some working time even if starting from a different value of $C_{T15}$ charge. Similarly, the steady-state voltage value for capacitor $C_{T24}$ is 2Vcc/6.

During Phase 2, switches S1a, S1b open, while switches S2a, S2b close. This has the effect of coupling tank capacitor $CT_{24}$ to load capacitor $C_{L,A}$ and load capacitor $C_{L,B}$. At this point, due to charge sharing, charge flows from the tank capacitor $CT_{24}$ to the load capacitor $C_{L,A}$, charging the load capacitor $C_{L,A}$ to the second step voltage V2 (equal to 2Vcc/6). Likewise, charge flows from the load capacitor $C_{L,B}$ to the tank capacitor $C_{T24}$, discharging the load capacitor $C_{L,B}$ to the fourth step voltage V4 (equal to 4Vcc/6).

During Phase 3, switches S2a, S2b open, while switch S3 closes. This has the effect of coupling load capacitor $C_{L,A}$ to load capacitor $C_{L,B}$, equalizing charge between the two such that their charge is both set to the third step voltage V3 (equal to 3Vcc/6). Thus, here, the discharge current from load capacitor CL,B flows to load capacitor CL,A, without the need for storing that charge in and discharging that charge from a tank capacitor.

During Phase 4, switch S3 opens, while switches S4a, S4b close. This has the effect of coupling tank capacitor $CT_{24}$ to load capacitor $C_{L,A}$ and load capacitor $C_{L,B}$. At this point, due to charge sharing, charge flows from the tank capacitor $CT_{24}$ to the load capacitor $C_{L,A}$, charging the load capacitor $C_{L,A}$ to the fourth step voltage V4 (equal to 4Vcc/6). Likewise, charge flows from the load capacitor $C_{L,B}$ to the tank capacitor $C_{T24}$, discharging the load capacitor $C_{L,B}$ to the second step voltage V2 (equal to 2Vcc/6).

During Phase 5, switches S4a, S4b open, while switches S5a, S5b close. This has the effect of coupling tank capacitor $CT_{15}$ to load capacitor $C_{L,A}$ and load capacitor $C_{L,B}$. At this point, due to charge sharing, charge flows from the tank capacitor $CT_{15}$ to the load capacitor $C_{L,A}$, charging the load capacitor $C_{L,A}$ to the fifth step voltage V5 (equal to 5Vcc/6). Likewise, charge flows from the load capacitor $C_{L,B}$ to the tank capacitor $C_{T15}$, discharging the load capacitor $C_{L,B}$ to the first step voltage V1 (equal to Vcc/6).

During Phase 6, switches S5a, S5b open, while switches S6a, S6b close. This has the effect of coupling load capacitor $C_{L,A}$ to Vcc, and coupling load capacitor $C_{L,B}$ to ground. Therefore, here, load capacitor $C_{L,B}$ is discharged to ground and load capacitor $C_{L,A}$ is charged to Vcc.

It should be appreciated that the reverse transition on the load capacitors $C_{L,A}$ and $C_{L,B}$ is done when, phases 5, 4, 3, 2, 1, and finally 0 are repeated, in that reverse order.

Returning to Phase 5, switches S6a, S6b open, while switches S5a, S5b close. This has the effect of coupling tank capacitor $CT_{15}$ to load capacitor $C_{L,A}$ and load capacitor $C_{L,B}$. At this point, due to charge sharing, charge flows from the tank capacitor $CT_{15}$ to the load capacitor $C_{L,B}$, charging the load capacitor $C_{L,B}$, to the first step voltage V1 (equal to Vcc/6). Likewise, charge flows from the load capacitor $C_{L,A}$ to the tank capacitor $C_{T15}$, discharging the load capacitor $C_{L,A}$ to the fifth step voltage V5 (equal to 5Vcc/6).

Returning to Phase 4, switches S5a, S5b open while switches S4a, S4b close. This has the effect of coupling tank capacitor $C_{T24}$ to load capacitor $C_{L,A}$ and load capacitor $C_{L,B}$. At this point, due to charge sharing, charge flows from the tank capacitor $C_{T24}$ to the load capacitor $C_{L,B}$, charging the load capacitor $C_{L,B}$, to the second step voltage V2 (equal to 2Vcc/6). Likewise, charge flows from the load capacitor $C_{L,A}$ to the tank capacitor $C_{T24}$, discharging the load capacitor $C_{L,A}$ to the fourth step voltage V4 (equal to 4Vcc/6).

Returning to Phase 3, switches S4a, S4b open, while switch S3 closes. This has the effect of coupling load capacitor $C_{L,A}$ to load capacitor $C_{L,B}$, equalizing charge between the two such that their charge is both set to the third step voltage V3 (equal to 3Vcc/6). Thus, here, the discharge current from load capacitor $C_{L,A}$ flows to load capacitor $C_{L,B}$, without the need for storing that charge in and discharging that charge from a tank capacitor.

Returning to Phase 2, switch S3 opens, while switches S2a, S2b close. This has the effect of coupling tank capacitor $CT_{24}$ to load capacitor $C_{L,A}$ and load capacitor $C_{L,B}$. At this point, due to charge sharing, charge flows from the tank capacitor $C_{T24}$ to the load capacitor $C_{L,B}$, charging the load capacitor $C_{L,B}$, to the fourth step voltage V4 (equal to 4Vcc/6). Likewise, charge flows from the load capacitor $C_{L,A}$ to the tank capacitor $C_{T24}$, discharging the load capacitor $C_{L,A}$ to the second step voltage V2 (equal to 2Vcc/6).

Returning to Phase 1, switches S2a, S2b open, while switches S1a, S1b close. This has the effect of coupling tank capacitor $CT_{15}$ to load capacitor $C_{L,A}$ and load capacitor $C_{L,B}$. At this point, due to charge sharing, charge flows from the tank capacitor $CT_{15}$ to the load capacitor $C_{L,B}$, charging the load capacitor $C_{L,B}$, to the fifth step voltage V5 (equal to 5Vcc/6). Likewise, charge flows from the load capacitor $C_{L,A}$ to the tank capacitor $C_{T15}$, discharging the load capacitor $C_{L,A}$ to the first step voltage V1 (equal to Vcc/6).

Finally, upon return to Phase 0, switches S1a, S1b open, while switches S0a, S0b close. This has the effect of coupling the load capacitor $C_{L,A}$ to ground and coupling the load capacitor $C_{L,B}$ to Vcc, and the full cycle of operation of the charge recovery driver 40 has been described. As to power dissipation, if $C_{L,A}=C_{L,B}=C$, with N representing the number of voltage steps (here, there are six steps between ground and Vcc) then the power dissipation of this charge recovery driver 40 is $(2CV^2f)/N$, as opposed to the $2CV^2f$ of a solution without charge recovery. Thus, this charge recovery driver 40 has reduced power dissipation by a factor of N=6, using M=2 tank capacitors, and 2N+1=13 switches, thereby reducing external capacitor number and on-chip area consumption as compared to prior designs utilizing six step voltage levels (an equivalent N=6 prior art solution would employ 5 tank capacitors and 14 switches).

Figure 7:
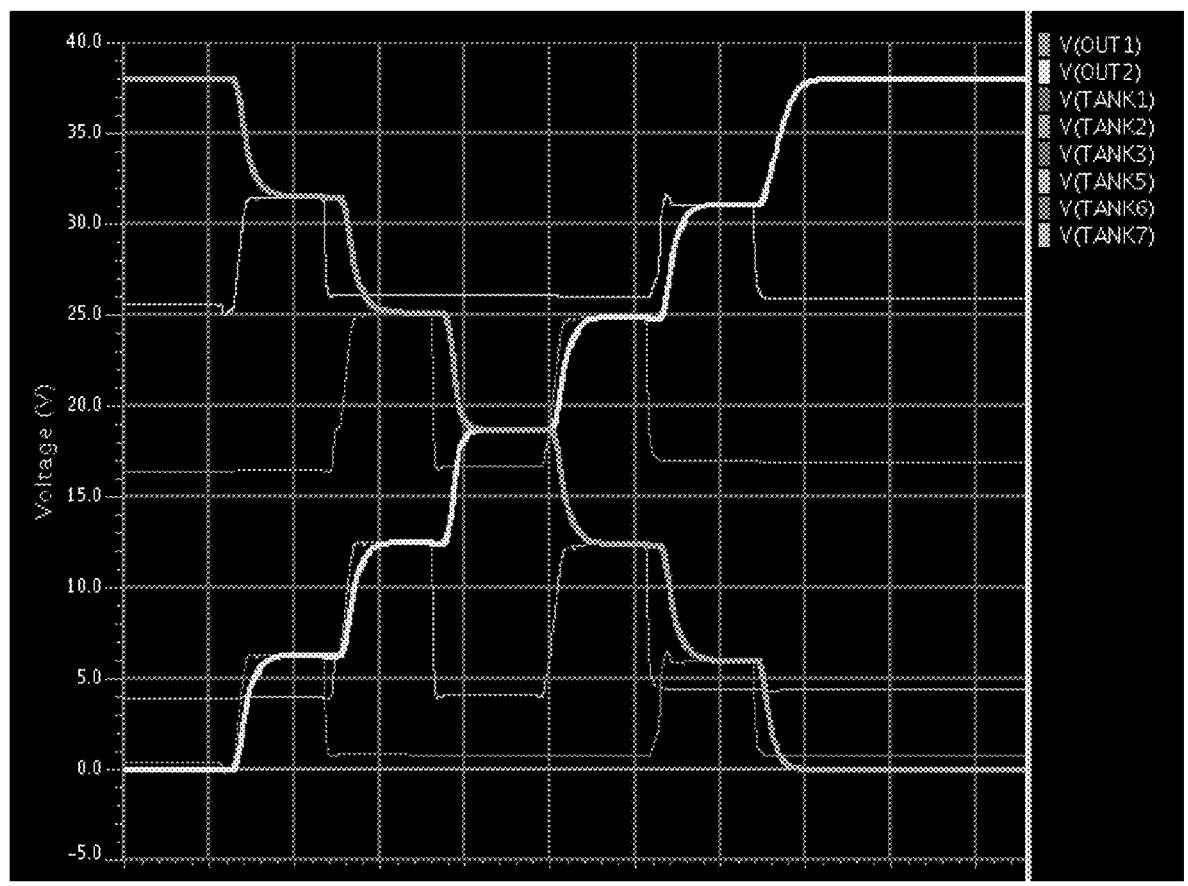
FIG. 7 shows simulation results of the charge recovery driver of FIG. 6A.

A simulation of the voltages of the load capacitor $C_{L,A}$ and load capacitor $C_{L,B}$ of the charge recovery driver 40 in operation can be observed in FIG. 7.

Third Improved Embodiment

Another design variant using floating tank capacitors, but with a control scheme that leaves the load capacitors floating for a period of time, will be described below. The principal change as compared to the first and second improved embodiments is that switches are added to couple one terminal of the tank capacitor to the supply voltage during certain operation phases and to couple the other terminal of the same tank capacitor to ground during certain other operation phases. In addition, for an embodiment with N=6 voltage steps, the second phase is split into two phases, namely phase 2 and phase 3. As will be explained below, during phase 2, the tank capacitor is coupled to the supply voltage, so the lower voltage end of the tank capacitor can be used to fix the voltage at the load capacitor $C_{L,A}$, while the load capacitor $C_{L,B}$ floats and maintains its current voltage value. Then, during Phase 3, the tank capacitor is connected to ground, so the high voltage end of the capacitor can be used to fix the voltage at the load capacitor $C_{L,B}$, while the load capacitor $C_{L,A}$ floats and maintains its current voltage value.

Figure 8A:
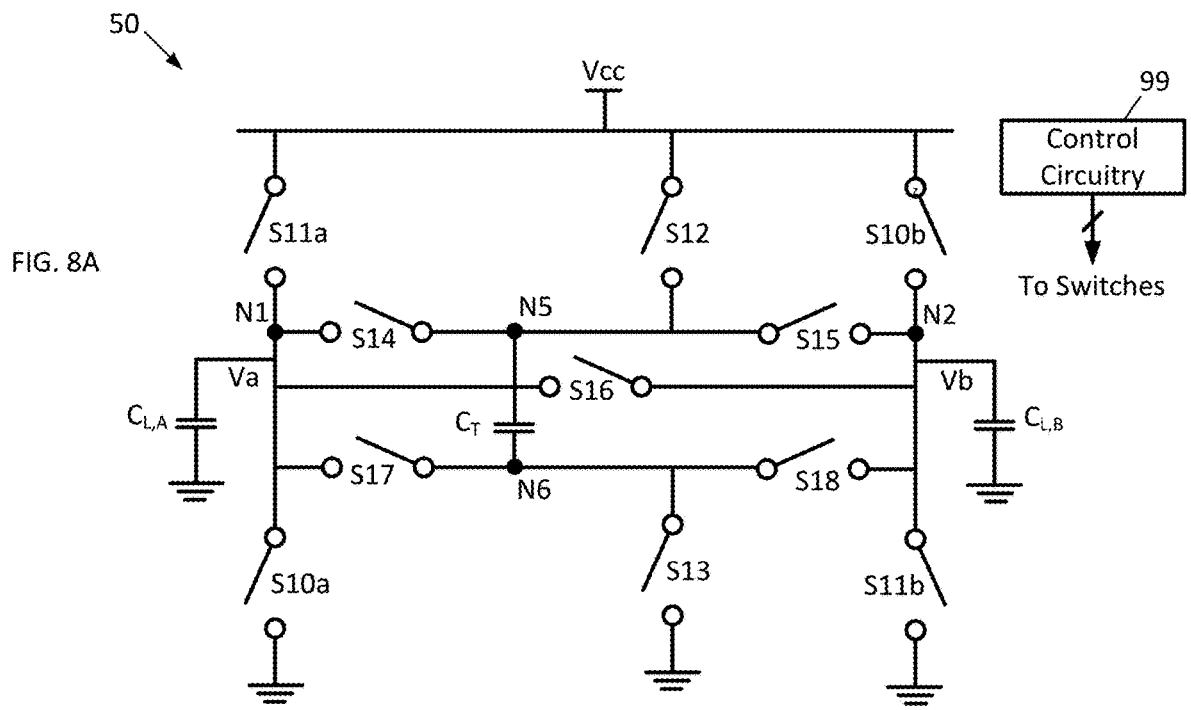
FIG. 8A shows a third improved charge recovery driver for a pair of loads that are modeled as a couple of capacitors, disclosed herein.

As shown in FIG. 8A, the charge recovery driver 50 includes load capacitor $C_{L,A}$ connected between node N1 and ground. A switch S10a is connected between node N1 and ground, while a switch S11a is connected between a supply voltage Vcc and node N1. The load capacitor $C_{L,B}$ is connected between node N2 and ground. A switch S11b is connected between node N2 and ground, while a switch S10b is connected between node N2 and Vcc.

A switch S12 is connected between nodes N5 and the supply voltage Vcc, and a switch S13 is connected between node N6 and ground. A switch S14 is connected between nodes N1 and N5, and a switch S15 is connected between nodes N5 and N2. A switch S16 is connected between nodes N1 and N2. A switch S17 is connected between nodes N1 and N6, and a switch S18 is connected between nodes N6 and N2. A tank capacitor $C_T$ is connected between nodes N5 and N6. Note that the tank capacitor may be a discrete device, and not integrated on-chip with the remainder of the charge recovery driver 50.

Figure 8B:
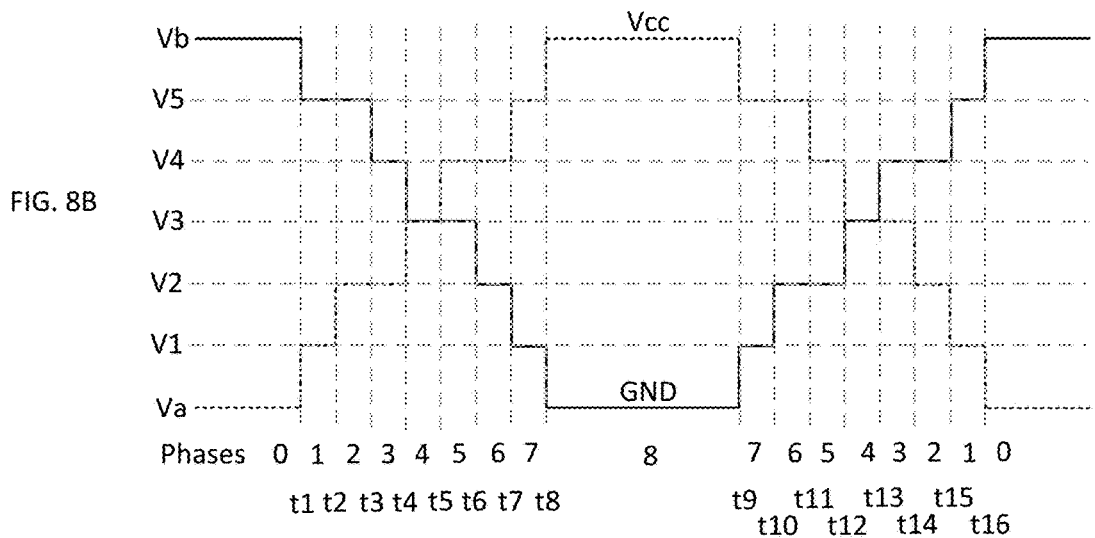
FIG. 8B is a graph showing the voltage at the load capacitors of the charge recovery driver of FIG. 8A during operation.

Operation of the charge recovery driver 50 is now described with additional reference to FIGS. 8B-8C. Appreciate that the operation will be described in phases, with each phase being long enough to achieve the complete charge transfer between tank capacitors and load capacitors and vice versa. Appreciate also that, in driver 50 and with the actuation sequence hereafter described, the steady-state voltage on tank capacitor $C_T$ is 4Vcc/6.

Initially during Phase 0, switches S10a, S10b close, coupling the load capacitor $C_{L,A}$ to ground to discharge it to ground, and coupling the load capacitor $C_{L,B}$ to the supply voltage Vcc to charge it to Vcc, as can be observed in FIG. 8B.

Next, during Phase 1, switches S15 and S17 close, while the remaining switches open. This has the effect of coupling tank capacitor $C_T$ to load capacitors $C_{L,A}$ and $C_{L,B}$. Due to charge transfer from tank capacitor $C_T$ to load capacitor $C_{L,A}$, this has the effect of charging load capacitor $C_{L,A}$ to the first step voltage V1 (equal to Vcc/6); conversely, due to charge transfer from load capacitor $C_{L,B}$ to tank capacitor $C_T$ this has the effect of discharging the load capacitor $C_{L,B}$ to the fifth step voltage V5 (equal to 5Vcc/6).

During Phase 2, switches S12 and S17 close, while the remaining switches open. This has the effect of coupling tank capacitor $C_T$ to Vcc, and coupling load capacitor $C_{L,A}$ to tank capacitor $C_T$. As a result, charge transfers from tank capacitor $C_T$ to load capacitor $C_{L,A}$ to charge load capacitor $C_{L,A}$ to the second step voltage V2 (equal to 2Vcc/6). Note that since switches S10b, S11b, S15, S16, and S18 are open, load capacitor $C_{L,B}$ floats, and therefore the charge on load capacitor $C_{L,B}$ does not change during Phase 2.

During Phase 3, switches S13 and S15 close, while the remaining switches open. This has the effect of grounding tank capacitor $C_T$, and coupling load capacitor $C_{L,B}$ to tank capacitor $C_T$. As a result, due to charge transfer from load capacitor $C_{L,B}$ to tank capacitor $C_T$, the load capacitor $C_{L,B}$ is discharged to the third step voltage V4 (equal to 4Vcc/6). Note that here, since switches S11a, S14, S16, S17, and S10a are open, load capacitor $C_{L,A}$ floats, and therefore the charge on load capacitor $C_{L,A}$ does not change during Phase 3, and remains at the second step voltage V2 (equal to 2Vcc/6).

During Phase 4, switch 16 closes while the remaining switches open, coupling load capacitors $C_{L,A}$ and $C_{L,B}$, equalizing charge between the two such that their charge is both set to the third step voltage V3 (equal to 3Vcc/6). Thus, here, the discharge current from load capacitor $C_{L,B}$ flows to load capacitor $C_{L,A}$, without the need for storing that charge in and discharging that charge from a tank capacitor.

During Phase 5, switches S13 and S14 close, while the remaining switches open. This has the effect of grounding the tank capacitor $C_T$, and coupling the load capacitor $C_{L,A}$ to the tank capacitor $C_T$. As a result, charge transfers from the tank capacitor $C_T$ to the load capacitor $C_{L,A}$, charging the load capacitor $C_{L,A}$ to the fourth step voltage V4 (equal to 4Vcc/6). Note that since switches S10b, S11b, S15, S16, and S18 are open, load capacitor $C_{L,B}$ floats, and therefore the charge on load capacitor $C_{L,B}$ does not change during Phase 5, remaining at V3 (equal to 3Vcc/6).

During Phase 6, switches S12 and S18 close while the remaining switches open. This has the effect of coupling the tank capacitor $C_T$ to the supply voltage Vcc, and of coupling the load capacitor $C_{L,B}$ to the tank capacitor $C_T$. Due to charge transfer from the load capacitor $C_{L,B}$ to the tank capacitor $C_T$, the load capacitor $C_{L,B}$ is discharged to the second step voltage (equal to 2Vcc/6). Note that here, since switches S11a, S14, S16, S17, and S10a are open, load capacitor $C_{L,A}$ floats, and therefore the charge on load capacitor $C_{L,A}$ does not change during Phase 6 and remains at the fourth step voltage V4 (equal to 4Vcc/6).

During Phase 7, switches S14 and S18 close while the remaining switches open. This has the effect of coupling tank capacitor $C_T$ to both the load capacitor $C_{L,A}$ and load capacitor $C_{L,B}$. Due to charge transfer from the load capacitor $C_{L,B}$ to the tank capacitor $C_T$, the load capacitor $C_{L,B}$ is discharged to the first step voltage V1 (equal to Vcc/6). Conversely, due to charge transfer from the tank capacitor $C_T$ to the load capacitor $C_{L,A}$, the load capacitor $C_{L,A}$ is charged to the fifth step voltage V5 (equal to 5Vcc/6).

During Phase 8, switches S11a, S11b close, while the remaining switches open, having the effect of coupling the load capacitor $C_{L,A}$ to the supply voltage Vcc and coupling the load capacitor $C_{L,B}$ to ground. Therefore, here, the load capacitor $C_{L,A}$ is charged to Vcc and the load capacitor $C_{L,B}$ is discharged to ground.

It should be appreciated that the reverse transition on the load capacitors $C_{L,A}$ and $C_{L,B}$ is done when phases 7, 6, 5, 4, 3, 2, 1, and finally 0 are repeated, in that reverse order.

Returning to Phase 7, switches S14 and S18 close while the remaining switches open. This has the effect of coupling the tank capacitor $C_T$ to both the load capacitor $C_{L,A}$ and load capacitor $C_{L,A}$. Due to charge transfer from the load capacitor $C_{L,A}$ to the tank capacitor $C_T$, the load capacitor $C_{L,A}$ is discharged to the fifth step voltage V5 (equal to 5Vcc/6). Conversely, due to charge transfer from the tank capacitor $C_T$ to the load capacitor $C_{L,B}$, the load capacitor $C_{L,B}$ is charged to the first step voltage V1 (equal to Vcc/6).

Returning to Phase 6, switches S12 and S18 close while the remaining switches open. This has the effect of coupling the tank capacitor $C_T$ to the supply voltage Vcc, and of coupling the load capacitor $C_{L,B}$ to the tank capacitor $C_T$. Due to charge transfer from the tank capacitor $C_T$ to the load capacitor $C_{L,B}$, the load capacitor $C_{L,B}$ is charged to the second step voltage V2 (equal to 2Vcc/6). Note that here, since switches S11a, S14, S16, S17, and S10a are open, load capacitor $C_{L,A}$ floats, and therefore the charge on load capacitor $C_{L,A}$ does not change during Phase 6 and remains at the fifth step voltage V5 (equal to 5Vcc/6).

Returning to Phase 5, switches S13 and S14 close, while the remaining switches open. This has the effect of grounding the tank capacitor $C_T$, and coupling the load capacitor $C_{L,A}$ to the tank capacitor $C_T$. As a result, charge transfers from the load capacitor $C_{L,A}$ to the tank capacitor CT, discharging the load capacitor $C_{L,A}$ to the fourth step voltage (equal to 4Vcc/6). Note that since switches S10b, S11b, S15, S16, and S18 are open, load capacitor $C_{L,B}$ floats, and therefore the charge on load capacitor $C_{L,B}$ does not change during Phase 5, remaining at the second step voltage V2 (equal to 2Vcc/6).

Returning to Phase 4, switch S16 closes, while the remaining switches open, coupling load capacitors $C_{L,A}$ and $C_{L,B}$, equalizing charge between the two such that their charge is both set to the third step voltage V3 (equal to 3Vcc/6). Thus, here, the discharge current from load capacitor $C_{L,A}$ flows to load capacitor $C_{L,B}$, without the need for storing that charge in and discharging that charge from a tank capacitor.

Returning to Phase 3, switches S13 and S15 close, while the remaining switches open, coupling the tank capacitor $C_T$ between the load capacitor $C_{L,B}$ and ground. This has the effect of charging the load capacitor $C_{L,B}$ to the fourth step voltage V4 (equal to 4Vcc/6). Since switches S11a, S14, S16, S17, and S10a are open, load capacitor $C_{L,A}$ floats, and therefore the charge on load capacitor $C_{L,A}$ does not change during Phase 3 and remains at the third step voltage V3 (equal to 3Vcc/6).

Returning to Phase 2, switches S12 and S17 close, while the remaining switches open, coupling tank capacitor $C_T$ between the supply voltage Vcc and the load capacitor $C_{L,A}$. As a result, charge transfers from the load capacitor $C_{L,A}$ to the tank capacitor $C_T$, discharging the load capacitor $C_{L,A}$ to the second step voltage V2 (equal to 2Vcc/6). Since switches S10b, S15, S16, S18, and S11b remain open, load capacitor $C_{L,B}$ floats, and therefore the charge on load capacitor $C_{L,B}$ remains the same at the fourth step voltage V4 (equal to 4Vcc/6).

Returning to Phase 1, switches S15 and S17 close, while the remaining switches open, coupling the tank capacitor $C_T$ between load capacitors $C_{L,A}$ and $C_{L,B}$. This has the effect of transferring charge from load capacitor $C_{L,A}$ to tank capacitor $C_T$ and from tank capacitor $C_T$ to load capacitor $C_{L,B}$ to charge load capacitor $C_{L,B}$ to the fifth step voltage V5 (equal to 5Vcc/6) and discharge the load capacitor $C_{L,A}$ to the first step voltage V1 (equal to Vcc/6).

Finally, upon return to phase 0, switches S10a and S10b close, while the remaining switches open, charging load capacitor $C_{L,B}$ to Vcc and fully discharging load capacitor $C_{L,A}$ to ground, and the full cycle of operation of the charge recovery driver 50 has been described. As to power dissipation, if $C_{L,A}=C_L$, $=C$, with N representing the number of voltage steps (here, there are six steps between ground and Vcc) then the power dissipation of this charge recovery driver 50 is $(2CV^2f)/N$, as opposed to the $2CV^2f$ of a solution without charge recovery. Thus, this charge recovery driver 50 has reduced power dissipation by a factor of N=6, using M=1 tank capacitors and 2N−1=11 switches, thereby reducing the number of external capacitors used as well as on-chip area consumption as compared to prior art designs utilizing six step voltage levels.

As compared to the second improved embodiment described herein in which N=6, for example in FIG. 6A, the transition time between low (ground) and high (Vcc) voltages for the load capacitors is longer, and more operation phases are utilized, leading to a slight increase in power losses. However, the number of switches (transistors) is reduced from 13 to 11, and the number of tank capacitors is reduced from 2 to 1 (meaning that the number of pads for the external tank capacitors is reduced from 4 to 2), reducing area consumption.

Expansion of Third Improved Embodiment to Utilize More Voltage Steps

An example showing expansion of the third improved embodiment to utilize N=8 voltage steps is now described with initial reference to FIG. 9A. Here, the charge recovery driver 60 includes a load capacitor $C_{L,A}$ connected between node N1 and ground, with a switch S11a being connected between node N1 and the supply voltage Vcc, and a switch S10a being connected between node N1 and ground. In addition, a load capacitor $C_{L,B}$ is connected between node N2 and ground, with a switch S10b being connected between node N2 and the supply voltage Vcc and a switch S11b being connected between node N2 and ground.

A switch S12 is connected between node N5 and the supply voltage Vcc. A switch S13 is connected between node N6 and ground. A tank capacitor $C_{Th}$ is connected between nodes N5 and N6, and a tank capacitor $C_{Tl}$ is connected between nodes N7 and N10. Note that the tank capacitors may be discrete devices, and not integrated on-chip with the remainder of the charge recovery driver 60.

A switch S14 is connected between nodes N1 and N5, and a switch S15 is connected between nodes N5 and N2. A switch S21 is connected between nodes N1 and N7, and a switch S22 is connected between nodes N7 and N2. A switch S16 is connected between nodes N1 and N2. A switch S19 is connected between nodes N1 and N10, and a switch S20 is connected between nodes N10 and N2. A switch S17 is connected between nodes N1 and N6, and a switch S18 is connected between nodes N6 and N2.

Operation of the charge recovery driver 60 is now described with additional reference to FIGS. 9B-9C. Appreciate that the operation will be described in phases, with each phase being long enough, to achieve the complete charge transfer between tank capacitors and load capacitors and vice versa. Appreciate also that, in driver 60 and with the actuation sequence hereafter described, the steady-state voltage on tank capacitor $C_{Th}$ is 6Vcc/8 and on tank capacitor $C_{Tl}$ is 2Vcc/8.

Initially, during Phase 0, switches S10a, S10b are closed while the other switches are open. As a result, load capacitor $C_{L,A}$ is coupled to ground and discharged, while load capacitor $C_{L,B}$ is charged to the supply voltage Vcc.

Next, during Phase 1, switches S15 and S17 close while the other switches are open, connecting load capacitors $C_{L,A}$ and $C_{L,B}$ to opposite plates of the tank capacitor $C_{Th}$. As a result, charge flows from load capacitor $C_{L,B}$ to tank capacitor $C_{Th}$, discharging load capacitor $C_{L,B}$ to the seventh step voltage V7 (equal to 7Vcc/8), and charge flows from tank capacitor $C_{Th}$ to load capacitor $C_{L,A}$, charging load capacitor $C_{L,A}$ to the first step voltage V1 (equal to Vcc/8).

During Phase 2, switches S12 and S17 close while the other switches are open, coupling tank capacitor $C_{Th}$ between Vcc and the load capacitor $C_{L,A}$, charging load capacitor $C_{L,A}$ to the second step voltage V2 (equal to 2Vcc/8). Since at this point, switches S10b, S15, S22, S16, S20, S18, and S11b remain open, load capacitor $C_{L,B}$ floats, and remains at its previous potential of the seventh step voltage V7 (equal to 7Vcc/8).

During Phase 3, switches S13 and S15 close while the other switches are open, coupling tank capacitor $C_{Th}$ between load capacitor $C_{L,B}$ and ground, discharging load capacitor $C_{L,B}$ to the sixth step voltage V6 (equal to 6Vcc/8). Since at this point, switches S11a, S14, S21, S16, S19, S17, and S10a remain open, load capacitor $C_{L,A}$ floats, and remains at its previous potential of the second step voltage V2 (equal to 2Vcc/8).

During Phase 4, switches S19 and S22 close while the other switches are open, coupling load capacitors $C_{L,A}$ and $C_{L,B}$ to opposite plates of the tank capacitor $C_{Ti}$. As a result, charge flows from load capacitor $C_{L,B}$ to tank capacitor $C_{Ti}$, discharging load capacitor $C_{L,B}$ to the fifth step voltage V5 (equal to 5Vcc/8), and charge flows from tank capacitor $C_{Ti}$ to load capacitor $C_{L,A}$, charging load capacitor $C_{L,A}$ to the third step voltage V3 (equal to 3Vcc/8).

During Phase 5, switch S16 closes while the other switches open, coupling load capacitors $C_{L,A}$ and $C_{L,B}$ to one another, with the result being that charge flows directly from load capacitor $C_{L,B}$ to load capacitor $C_{L,A}$ such that both load capacitors have their charge set to the fourth step voltage V4 (equal to 4Vcc/8).

During Phase 6, switches S20 and S21 close while the other switches open, coupling load capacitors $C_{L,A}$ and $C_{L,B}$ to opposite plates of the tank capacitor $C_{Ti}$. As a result, charge flows from load capacitor $C_{L,B}$ to tank capacitor $C_{Ti}$, discharging load capacitor $C_{L,B}$ to the third step voltage V3 (equal to 3Vcc/8), and charge flows from tank capacitor $C_{Ti}$ to load capacitor $C_{L,A}$, charging load capacitor $C_{L,A}$ to the fifth step voltage V5 (equal to 5Vcc/8).

During Phase 7, switches S13 and S14 close, coupling tank capacitor $C_{th}$ between load capacitor $C_{L,A}$ and ground. This has the effect of charging load capacitor $C_{L,A}$ to the sixth step voltage V6 (equal to 6Vcc/8). Since switches S10b, S15, S22, S16, S20, S18, and S11b remain open, load capacitor $C_{L,B}$ remains floating, and its charge remains unchanged at the third step voltage V3 (equal to 3Vcc/8).

During Phase 8, switches S12 and S18 close while the other switches open, coupling tank capacitor $C_{Th}$ between load capacitor $C_{L,B}$ and the supply voltage Vcc. As a result, charge flows from the load capacitor $C_{L,B}$ to the tank capacitor $C_{Th}$, discharging the load capacitor $C_{L,B}$ to the second step voltage V2 (equal to 2Vcc/8). Since at this point, switches S11a, S14, S21, S16, S19, S17, and S10a remain open, load capacitor $C_{L,A}$ floats, and remains at its previous potential of the sixth step voltage V6 (equal to 6Vcc/8).

During Phase 9, switches S14 and S18 close while the other switches open, coupling tank capacitor $C_{Th}$ between load capacitors $C_{L,A}$ and $C_{L,B}$. As a result, load capacitor $C_{L,B}$ transfers charge to the tank capacitor $C_{Th}$, discharging load capacitor $C_{L,B}$ to the first step voltage V1 (equal to Vcc/8). Similarly, the tank capacitor $C_{Th}$ transfers charge to the load capacitor $C_{L,A}$, charging load capacitor $C_{L,A}$ to the seventh step voltage V7 (equal to 7Vcc/8).

During Phase 10, switches S11a and S11b close while the other switches open, coupling the load capacitor $C_{L,A}$ to the supply voltage Vcc and the load capacitor $C_{L,B}$ to ground to fully discharge the load capacitor $C_{L,B}$ and to charge the load capacitor $C_{L,A}$ to VCC.

It should be appreciated that next, the reverse transition on the load capacitors $C_{L,A}$ and $C_{L,B}$ is done when Phases 9, 8, 7, 6, 5, 4, 3, 2, 1, and finally 0 are repeated, in that reverse order.

Returning to Phase 9, switches S14 and S18 close while the other switches open, coupling tank capacitor $C_{Th}$ between load capacitors $C_{L,A}$ and $C_{L,B}$. As a result, load capacitor $C_{L,A}$ transfers charge to the tank capacitor $C_{Th}$, discharging load capacitor $C_{L,A}$ to the seventh step voltage V7 (equal to 7Vcc/8). Similarly, the tank capacitor $C_{Th}$ transfers charge to the load capacitor $C_{L,B}$, charging load capacitor $C_{L,B}$ to the first step voltage V1 (equal to Vcc/8).

Returning to Phase 8, switches S12 and S18 close while the other switches open, coupling tank capacitor $C_{Th}$ between load capacitor $C_{L,B}$ and the supply voltage Vcc. As a result, charge flows from the tank capacitor $C_{Th}$ to the load capacitor $C_{L,B}$, charging the load capacitor $C_{L,B}$ to the second step voltage V2 (equal to 2Vcc/8). Since at this point, switches S11a, S14, S21, S16, S19, S17, and S10a remain open, load capacitor $C_{L,A}$ floats, and remains at its previous potential of the seventh step voltage V7 (equal to 7Vcc/8).

Returning to Phase 7, switches S13 and S14 close, coupling tank capacitor $C_{th}$ between load capacitor $C_{L,A}$ and ground. This has the effect of discharging load capacitor $C_{L,A}$ to the sixth step voltage V6 (equal to 6Vcc/8). Since switches S10b, S15, S22, S16, S20, S18, and S11b remain open, load capacitor $C_{L,B}$ remains floating, and its charge remains unchanged at the second step voltage V2 (equal to 2Vcc/8).

Returning to Phase 6, switches S20 and S21 close while the other switches open, coupling load capacitors $C_{L,A}$ and $C_{L,B}$ to opposite plates of the tank capacitor $C_{Ti}$. As a result, charge flows from load capacitor $C_{L,A}$ to tank capacitor $C_{Ti}$, discharging load capacitor $C_{L,A}$ to the fifth step voltage V5 (equal to 5Vcc/8), and charge flows from tank capacitor $C_{Ti}$ to load capacitor $C_{L,B}$, charging load capacitor $C_{L,B}$ to the third step voltage V3 (equal to 3Vcc/8).

Returning to Phase 5, switch S16 closes while the other switches open, coupling load capacitors $C_{L,A}$ and $C_{L,B}$ to one another, with the result being that charge flows directly from load capacitor $C_{L,A}$ to load capacitor $C_{L,B}$ such that both load capacitors have their charge set to the fourth step voltage V4 (equal to 4Vcc/8).

Returning to Phase 4, switches S19 and S22 close while the other switches are open, coupling load capacitors $C_{L,A}$ and $C_{L,B}$ to opposite plates of the tank capacitor $C_{Ti}$. As a result, charge flows from load capacitor $C_{L,A}$ to tank capacitor $C_{Ti}$, discharging load capacitor $C_{L,A}$ to the third step voltage V3 (equal to 3Vcc/8), and charge flows from tank capacitor $C_{Ti}$ to load capacitor $C_{L,B}$, charging load capacitor $C_{L,B}$ to the fifth step voltage V5 (equal to 5Vcc/8).

Returning to Phase 3, switches S13 and S15 close while the other switches are open, coupling tank capacitor $C_{Th}$ between load capacitor $C_{L,B}$ and ground, charging load capacitor $C_{L,B}$ to the sixth step voltage V6 (equal to 6Vcc/8). Since at this point, switches S11a, S14, S21, S16, S19, S17, and S10a remain open, load capacitor $C_{L,A}$ floats, and remains at its previous potential of the third step voltage V3 (equal to 3Vcc/8).

Returning to Phase 2, switches S12 and S17 close while the other switches are open, coupling tank capacitor $C_{Th}$ between Vcc and the load capacitor $C_{L,A}$, discharging load capacitor $C_{L,A}$ to the second step voltage V2 (equal to 2Vcc/8). Since at this point, switches S10b, S15, S22, S16, S20, S18, and S11b remain open, load capacitor $C_{L,B}$ floats, and remains at its previous potential of the sixth step voltage V6 (equal to 6Vcc/8).

Returning to Phase 1, switches S15 and S17 close while the other switches are open, connecting load capacitors $C_{L,A}$ and $C_{L,B}$ to opposite plates of the tank capacitor $C_{Th}$. As a result, charge flows from load capacitor $C_{L,A}$ to tank capacitor $C_{Th}$, discharging load capacitor $C_{L,A}$ to the first step voltage V1 (equal to Vcc/8), and charge flows from tank capacitor $C_{Th}$ to load capacitor $C_{L,B}$, charging load capacitor $C_{L,B}$ to the seventh step voltage V7 (equal to 7Vcc/8).

Figure 10:
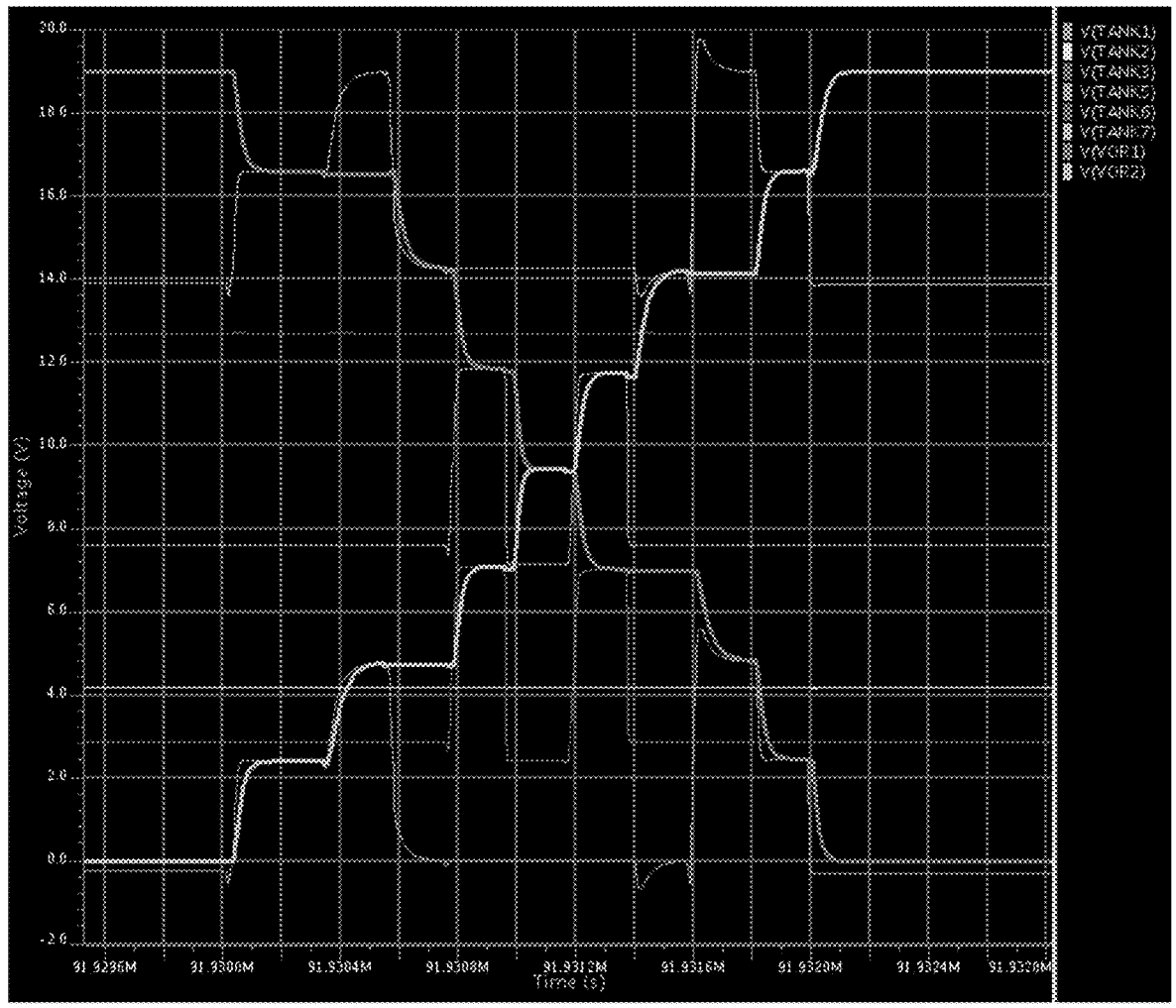
FIG. 10 shows simulation results of the charge recovery driver of FIG. 9A.

Returning to Phase 0, switches S10a, S10b are closed while the other switches are open. As a result, load capacitor $C_{L,A}$ is coupled to ground and discharged, while load capacitor $C_{L,B}$ is charged to the supply voltage Vcc, and the full cycle of operation of the charge recovery driver 60 has been described. As to power dissipation, if $C_{L,A}=C_{L,B}=C$, with N representing the number of voltage steps (here, there are eight steps between ground and Vcc) then the power dissipation of this charge recovery driver 60 is $(2CV^2f)/N$. Thus, this charge recovery driver 60 has reduced power dissipation by a factor of N=8, using M=2 tank capacitors and 15 switches, thereby reducing external capacitors number and on-chip area consumption as compared to prior art designs relative to eight step voltage levels, which are usually done utilizing 7 tank capacitors and 18 switches. A simulation of the voltages of the load capacitor $C_{L,A}$ and load capacitor $C_{L,B}$ of the charge recovery driver 60 in operation can be observed in FIG. 10.

Another Expansion of Third Improved Embodiment to Utilize More Voltage Steps

An example showing expansion of the third improved embodiment to utilize N=10 voltage steps is now described with initial reference to FIG. 11A. Here, the charge recovery driver 70 includes a load capacitor $C_{L,A}$ connected between node N1 and ground, with a switch S11a being connected between node N1 and the supply voltage Vcc, and a switch S10a being connected between node N1 and ground. In addition, a load capacitor $C_{L,B}$ is connected between node N2 and ground, with a switch S10b being connected between node N2 and the supply voltage Vcc and a switch S11b being connected between node N2 and ground.

A switch S14 is coupled between node N1 and node N5, and a switch S15 is coupled between node N5 and node N2. A switch S12 is coupled between N5 and the supply voltage Vcc. A switch S21 is coupled between node N1 and node N7, and a switch S22 is coupled between node N7 and node N2. A switch S24 is connected between the supply voltage Vcc and node N7. A switch S16 is coupled between nodes N1 and N2. A switch S19 is coupled between node N1 and node N10, and a switch S20 is coupled between node N10 and node N2. A tank capacitor $C_{TT}$ is coupled between nodes N7 and N10. A switch S13 is coupled between node N10 and ground. A switch S17 is coupled between node N1 and node N6, and a switch S18 is coupled between node N6 and node N2. A tank capacitor $C_{Th}$ is coupled between node N5 and node N6. A switch S23 is coupled between node N6 and ground. Operation of the charge recovery driver 70 is now described with additional reference to FIGS. 11B-11C. Appreciate that the operation will be described in phases, with each phase being long enough to achieve the complete charge transfer between tank capacitors and load capacitors and vice versa. Appreciate also that, in driver 70 and with the actuation sequence hereafter described, the steady-state voltage on tank capacitor $C_{Th}$ is 8Vcc/10 and on tank capacitor $C_{Ti}$ is 4Vcc/10.

Initially during Phase 0, switches S10a, S10b close, coupling the load capacitor $C_{L,A}$ to ground to discharge it to ground, and coupling the load capacitor $C_{L,B}$ to the supply voltage Vcc to charge it to Vcc, as can be observed in FIG. 11B.

Next, during Phase 1, switches S15 and S17 close, while the other switches open. This has the effect is coupling tank capacitor $C_{Th}$ between load capacitors $C_{L,A}$ and $C_{L,B}$. As a result, charge transfers from the load capacitor $C_{L,B}$ to tank capacitor $C_{Th}$, discharging load capacitor $C_{L,B}$ to the ninth step voltage V9 (equal to 9Vcc/10). In addition, charge is transferred from tank capacitor $C_{Th}$ to load capacitor $C_{L,A}$, charging load capacitor $C_{L,A}$ to the first step voltage V1 (equal to Vcc/10).

During Phase 2, switches S12 and S17 close, while the other switches open. This has the effect of coupling tank capacitor $C_{Th}$ between the supply voltage Vcc and the load capacitor $C_{L,A}$. As a result, the load capacitor $C_{L,A}$ is charged to the second step voltage (equal to 2Vcc/10). Since switches S10b, S15, S22, S16, S20, S18, and S11b are open at this point, load capacitor $C_{L,B}$ floats, and remains at its previous voltage of V9 (equal to 9Vcc/10).

During Phase 3, switches S15 and S23 close, while the other switches open. This has the effect of coupling tank capacitor $C_{Th}$ between load capacitor $C_{L,B}$ and ground, and load capacitor $C_{L,B}$ transfers charge to tank capacitor $C_{Th}$ to thereby discharge load capacitor $C_{L,B}$ to the eighth step voltage V8 (equal to 8Vcc/10). Since switches S11a, S14, S21, S16, S19, S17, and S10a are open, load capacitor $C_{L,A}$ floats and remains at its previous voltage of V2 (equal to 2Vcc/10).

During Phase 4, switches S19 and S22 close, while the other switches open. This has the effect of coupling tank capacitor $C_{TT}$ between load capacitor $C_{L,B}$ and load capacitor $C_{L,A}$. Charge transfers from load capacitor $C_{L,B}$ to tank capacitor $C_{TT}$, discharging load capacitor $C_{L,B}$ to the seventh step voltage V7 (equal to 7Vcc/10). Similarly, charge transfers from the tank capacitor $C_{TT}$ to the load capacitor $C_{L,A}$, charging the load capacitor $C_{L,A}$ to the third step voltage V3 (equal to 3Vcc/10).

During Phase 5, switches S13 and S21 close, while the other switches open. This has the effect of coupling tank capacitor $C_{TT}$ between load capacitor $C_{L,A}$ and ground, with the result being that the load capacitor $C_{L,A}$ is charged to the fourth step voltage V4 (equal to 4Vcc/10). Since switches S10b, S15, S22, S16, S20, S18, and S11b are open at this point, load capacitor $C_{L,B}$ floats, and remains at its previous voltage of V7 (equal to 7Vcc/10).

During Phase 6, switches S20 and S24 close, while the other switches open. This has the effect of coupling tank capacitor $C_{TT}$ between load capacitor $C_{L,B}$ and the supply voltage Vcc, with the effect of charge being transferred from the load capacitor $C_{L,B}$ to the tank capacitor $C_{TT}$, discharging the load capacitor $C_{L,B}$ to the sixth step voltage V6 (equal to 6Vcc/10). Since switches S11a, S14, S21, S16, S19, S17, and S10a are open, load capacitor $C_{L,A}$ floats and remains at its previous voltage of V4 (equal to 4Vcc/10).

During Phase 7, switch 16 closes, coupling load capacitors $C_{L,A}$ and $C_{L,B}$, permitting direct charge transfer from load capacitor $C_{L,B}$ to load capacitor $C_{L,A}$ with the result being that both load capacitors are set to the fifth step voltage V5 (equal to 5Vcc/10).

During Phase 8, switches S19 and S24 close, while the other switches open. This has the effect of coupling tank capacitor $C_{TT}$ between the supply voltage Vcc and the load capacitor $C_{L,A}$ to thereby charge load capacitor $C_{L,A}$ to the sixth step voltage V6 (equal to 6Vcc/10). Since switches S10b, S15, S22, S16, S20, S18, and S11b are open at this point, load capacitor $C_{L,B}$ floats, and remains at its previous voltage of V5 (equal to 5Vcc/10).

During Phase 9, switches S13 and S22 close, while the other switches open. This has the effect of coupling tank capacitor $C_{TI}$ between load capacitor $C_{L,B}$ and ground, discharging the load capacitor $C_{L,B}$ to the fourth step voltage V4 (equal to 4Vcc/10). Since switches S11a, S14, S21, S16, S19, S17, and S10a are open, load capacitor $C_{L,A}$ floats and remains at its previous voltage of V6 (equal to 6Vcc/10).

During Phase 10, switches S20 and S21 close, while the other switches open. This couples the tank capacitor $C_{TI}$ between load capacitor $C_{L,A}$ and load capacitor $C_{L,B}$. Charge transfers from load capacitor $C_{L,B}$ to the tank capacitor $C_{TI}$ discharging the load capacitor $C_{L,B}$ to the third step voltage V3 (equal to 3Vcc/10). Likewise, charge transfers from the tank capacitor $C_{TI}$ to the load capacitor $C_{L,A}$, charging the load capacitor $C_{L,A}$ to the seventh step voltage V7 (equal to 7Vcc/10).

During Phase 11, switches S14 and S23 close, while the other switches open. This couples tank capacitor $C_{Th}$ between load capacitor $C_{L,A}$ and ground, and charge transfers from tank capacitor $C_{Th}$ to load capacitor $C_{L,A}$ to charge load capacitor $C_{L,A}$ to the eighth step voltage V8 (equal to 8Vcc/10). Since switches S10b, S15, S22, S16, S20, S18, and S11b are open at this point, load capacitor $C_{L,B}$ floats, and remains at its previous voltage of V3 (equal to 3Vcc/10).

During Phase 12, switches S12 and S18 close, while the other switches open. This couples tank capacitor $C_{TH}$ between the supply voltage and the load capacitor $C_{L,B}$. Charge transfers from the load capacitor $C_{L,B}$ to the tank capacitor $C_{TH}$, discharging load capacitor $C_{L,B}$ to the second step voltage V2 (equal to 2Vcc/10). Since switches S11a, S14, S21, S16, S19, S17, and S10a are open, load capacitor $C_{L,A}$ floats and remains at its previous voltage of V8 (equal to 8Vcc/10).

During Phase 13, switches S14 and S18 close, while the other switches open. This couples tank capacitor $C_{TH}$ between load capacitor $C_{L,A}$ and load capacitor $C_{L,B}$. Charge transfers from load capacitor $C_{L,B}$ to tank capacitor $C_{TH}$, discharging load capacitor $C_{L,B}$ to the first step voltage V1 (equal to Vcc/10). Likewise, charge transfers from tank capacitor $C_{TH}$ to load capacitor $C_{L,A}$, charging load capacitor $C_{L,A}$ to the ninth step voltage V9 (equal to 9Vcc/10).

During Phase 14, switches S11a, S11b close, while the other switches open. This couples load capacitor $C_{L,A}$ to the supply voltage Vcc to charge load capacitor $C_{L,A}$ to Vcc, and couples load capacitor $C_{L,B}$ to ground to fully discharge load capacitor $C_{L,B}$ to ground.

It should be appreciated that the reverse transition on the load capacitors $C_{L,A}$ and $C_{L,B}$ is done when phases 13, 12, 11, 10, 9, 8, 7, 6, 5, 4, 3, 2, 1, and finally 0 are repeated, in that reverse order.

Returning to Phase 13, switches S14 and S18 close, while the other switches open. This couples tank capacitor $C_{TH}$ between load capacitor $C_{L,A}$ and load capacitor $C_{L,B}$. Charge transfers from load capacitor $C_{L,A}$ to tank capacitor $C_{TH}$, discharging load capacitor $C_{L,A}$ to the ninth step voltage V9 (equal to 9Vcc/10). Likewise, charge transfers from tank capacitor $C_{TH}$ to load capacitor $C_{L,B}$, charging load capacitor $C_{L,B}$ to the first step voltage V1 (equal to Vcc/10).

Returning to Phase 12, switches S12 and S18 close, while the other switches open. This couples tank capacitor $C_{TH}$ between the supply voltage and the load capacitor $C_{L,B}$. Charge transfers from the tank capacitor $C_{TH}$ to the load capacitor $C_{L,B}$, charging load capacitor $C_{L,B}$ to the second step voltage V2 (equal to 2Vcc/10). Since switches S11a, S14, S21, S16, S19, S17, and S10a are open, load capacitor $C_{L,A}$ floats and remains at its previous voltage of V9 (equal to 9Vcc/10).

Returning to Phase 11, switches S14 and S23 close, while the other switches open. This couples tank capacitor $C_{Th}$ between load capacitor $C_{L,A}$ and ground, and charge transfers from load capacitor $C_{L,A}$ to tank capacitor $C_{Th}$ to discharge load capacitor $C_{L,A}$ to the eighth step voltage V8 (equal to 8Vcc/10). Since switches S10b, S15, S22, S16, S20, S18, and S11b are open at this point, load capacitor $C_{L,B}$ floats, and remains at its previous voltage of V2 (equal to 2Vcc/10).

Returning to Phase 10, switches S20 and S21 close, while the other switches open. This couples the tank capacitor $C_{TI}$ between load capacitor $C_{L,A}$ and load capacitor $C_{L,B}$. Charge transfers from load capacitor $C_{L,A}$ to the tank capacitor $C_{TI}$, discharging the load capacitor $C_{L,A}$ to the seventh step voltage V7 (equal to 7Vcc/10). Likewise, charge transfers from the tank capacitor $C_{TI}$ to the load capacitor $C_{L,B}$, charging the load capacitor $C_{L,B}$ to the third step voltage V3 (equal to 3Vcc/10).

Returning to Phase 9, switches S13 and S22 close, while the other switches open. This has the effect of coupling tank capacitor $C_{TI}$ between load capacitor $C_{L,B}$ and ground, charging the load capacitor $C_{L,B}$ to the fourth step voltage V4 (equal to 4Vcc/10). Since switches S11a, S14, S21, S16, S19, S17, and S10a are open, load capacitor $C_{L,A}$ floats and remains at its previous voltage of V7 (equal to 7Vcc/10).

Returning to Phase 8, switches S19 and S24 close, while the other switches open. This has the effect of coupling tank capacitor $C_{TI}$ between the supply voltage Vcc and the load capacitor $C_{L,A}$ to thereby discharge load capacitor $C_{L,A}$ to the sixth step voltage V6 (equal to 6Vcc/10). Since switches S10b, S15, S22, S16, S20, S18, and S11b are open at this point, load capacitor $C_{L,B}$ floats, and remains at its previous voltage of V4 (equal to 4Vcc/10).

Returning to Phase 7, switch 16 closes, while the other switches open, coupling load capacitors $C_{L,A}$ and $C_{L,B}$, permitting direct charge transfer from load capacitor $C_{L,A}$ to load capacitor $C_{L,B}$ with the result being that both load capacitors are set to the fifth step voltage V5 (equal to 5Vcc/10).

Returning to Phase 6, switches S20 and S24 close, while the other switches open. This has the effect of coupling tank capacitor $C_{TI}$ between load capacitor $C_{L,B}$ and the supply voltage Vcc, with the effect of charge being transferred from the tank capacitor $C_{TI}$ to the load capacitor $C_{L,B}$, charging the load capacitor $C_{L,B}$ to the sixth step voltage V6 (equal to 6Vcc/10). Since switches S11a, S14, S21, S16, S19, S17, and S10a are open, load capacitor $C_{L,A}$ floats and remains at its previous voltage of V5 (equal to 5Vcc/10).

Returning to Phase 5, switches S13 and S21 close, while the other switches open. This has the effect of coupling tank capacitor $C_{TI}$ between load capacitor $C_{L,A}$ and ground, with the result being that charge is transferred from the load capacitor $C_{L,A}$ to the tank capacitor $C_{TI}$ such that the load capacitor $C_{L,A}$ is discharged to the fourth step voltage V4 (equal to 4Vcc/10). Since switches S10b, S15, S22, S16, S20, S18, and S11b are open at this point, load capacitor $C_{L,B}$ floats, and remains at its previous voltage of V6 (equal to 6Vcc/10).

Returning to Phase 4, switches S19 and S22 close, while the other switches open. This has the effect of coupling tank capacitor $C_{TI}$ between load capacitor $C_{L,B}$ and load capacitor $C_{L,A}$. Charge transfers from load capacitor $C_{L,A}$ to tank capacitor $C_{TI}$, discharging load capacitor $C_{L,A}$ to the third step voltage V3 (equal to 3Vcc/10). Similarly, charge transfers from the tank capacitor $C_{TT}$ to the load capacitor $C_{L,B}$, charging the load capacitor $C_{L,B}$ to the seventh step voltage V7 (equal to 7Vcc/10).

Returning to Phase 3, switches S15 and S23 close, while the other switches open. This has the effect of coupling tank capacitor $C_{Th}$ between load capacitor $C_{L,B}$ and ground, and tank capacitor $C_{Th}$ transfers charge to load capacitor $C_{L,B}$ to thereby charge load capacitor $C_{L,B}$ to the eighth step voltage V8 (equal to 8Vcc/10). Since switches S11a, S14, S21, S16, S19, S17, and S10a are open, load capacitor $C_{L,A}$ floats and remains at its previous voltage of V3 (equal to 3Vcc/10).

Returning to Phase 2, switches S12 and S17 close, while the other switches open. This has the effect of coupling tank capacitor $C_{Th}$ between the supply voltage Vcc and the load capacitor $C_{L,A}$. As a result of charge transfer from the load capacitor $C_{L,A}$ to the tank capacitor $C_{Th}$, the load capacitor $C_{L,A}$ is discharged to the second step voltage V2 (equal to 2Vcc/10). Since switches S10b, S15, S22, S16, S20, S18, and S11b are open at this point, load capacitor $C_{L,B}$ floats, and remains at its previous voltage of V8 (equal to 8Vcc/10).

Returning to Phase 1, switches S15 and S17 close, while the other switches open. This has the effect is coupling tank capacitor $C_{Th}$ between the load capacitors $C_{L,A}$ and $C_{L,B}$. As a result, charge transfers from the tank capacitor $C_{Th}$ to load capacitor $C_{L,B}$, charging load capacitor $C_{L,B}$ to the ninth step voltage V9 (equal to 9Vcc/10). In addition, charge is transferred from load capacitor $C_{L,A}$ to the tank capacitor $C_{Th}$, discharging load capacitor $C_{L,A}$ to the first step voltage V1 (equal to Vcc/10).

Returning to Phase 0, switches S10a, S10b close, coupling the load capacitor $C_{L,A}$ to ground to discharge it to ground, and coupling the load capacitor $C_{L,B}$ to the supply voltage Vcc to charge it to Vcc, as can be observed in FIG. 11B. Hence, the full cycle of operation of the charge recovery driver 70 has been described. As to power dissipation, if $C_{L,A}=C_{L,B}=C$, with N representing the number of voltage steps (here, there are ten steps between ground and Vcc) then the power dissipation of this charge recovery driver 70 is $(2CV^2f)/N$. Thus, this charge recovery driver 70 has reduced power dissipation by a factor of N=10, using M=2 tank capacitors and 17 switches, thereby reducing external capacitors number and on-chip area consumption as compared to prior art designs relative to ten step voltage levels, which are usually done utilizing 9 tank capacitors and 22 switches.

Expansion of Third Improved Embodiment to Utilize More Voltage Steps

An example showing expansion of the third improved embodiment to utilize N=14 voltage steps is now described with initial reference to FIG. 12A. Here, the charge recovery driver 80 includes a load capacitor $C_{L,A}$ connected between node N1 and ground, with a switch S11a being connected between node N1 and the supply voltage Vcc, and a switch S10a being connected between node N1 and ground. In addition, a load capacitor $C_{L,B}$ is connected between node N2 and ground, with a switch S10b being connected between node N2 and the supply voltage Vcc and a switch S11b being connected between node N2 and ground.

A switch S14 is coupled between node N1 and node N5, and a switch S15 is coupled between node N5 and node N2. A switch S12 is coupled between N5 and the supply voltage Vcc. A switch S21 is coupled between node N1 and node N7, and a switch S22 is coupled between node N7 and node N2. A switch S24 is connected between the supply voltage Vcc and node N7. A switch S25 is coupled between nodes N6 and N7. A switch S16 is coupled between nodes N1 and N2.

A switch S19 is coupled between node N1 and node N10, and a switch S20 is coupled between node N10 and node N2. A tank capacitor $C_{TT}$ is coupled between nodes N7 and N10. A switch S13 is coupled between node N10 and ground. A switch S17 is coupled between node N1 and node N6, and a switch S18 is coupled between node N6 and node N2. A tank capacitor $C_{Th}$ is coupled between node N5 and node N6. A switch S23 is coupled between node N6 and ground.

Operation of the charge recovery driver 80 is now described with additional reference to FIGS. 12B-12C. Appreciate that the operation will be described in phases, with each phase being long enough to achieve the complete charge transfer between tank capacitors and load capacitors and vice versa. Appreciate also that, in driver 80 and with the actuation sequence hereafter described, the steady-state voltage on tank capacitor $C_{Th}$ is 8Vcc/14 and on tank capacitor $C_{TT}$ is 4Vcc/14.

Initially during Phase 0, switches S10a, S10b close, coupling the load capacitor $C_{L,A}$ to ground to discharge it to ground, and coupling the load capacitor $C_{L,B}$ to the supply voltage Vcc to charge it to Vcc, as can be observed in FIG. 12B.

During Phase 1, switches S15, S19, and S25 close while the other switches open, connecting tank capacitors $C_{Th}$ and $C_{TT}$ in series between load capacitors $C_{L,B}$ and $C_{L,A}$. As a result, load capacitor $C_{L,B}$ transfers charge to the series capacitance of $C_{Th}+C_{TT}$, discharging load capacitor $C_{L,B}$ to the thirteenth step voltage V13 (equal to 13Vcc/14), and the series capacitance of $C_{Th}+C_{TT}$ transfers charge to the load capacitor $C_{L,A}$, charging it to the first step voltage V1 (equal to Vcc/14).

During Phase 2, switches S12, S19, and S25 close while the other switches open, connecting tank capacitors $C_{Th}$ and $C_{TT}$ in series between the supply voltage Vcc and the load capacitor $C_{L,A}$. As a result, the series capacitance of $C_{Th}+C_{TT}$ transfers charge to the load capacitor $C_{L,A}$, charging the load capacitor $C_{L,A}$ to the second step voltage V2 (equal to 2Vcc/14). Since switches S10b, S15, S22, S16, S20, S18, and S11b are open, load capacitor $C_{L,B}$ floats, and the charge on load capacitor $C_{L,B}$ therefore remains at its previous value of V13 (equal to 13Vcc/14).

During Phase 3, switches S13, S15, and S25 close while the other switches open, connecting tank capacitors $C_{Th}$ and $C_{TT}$ in series between load capacitance $C_{L,B}$ and ground. As a result, the load capacitance $C_{L,B}$ transfers charge to the series capacitance $C_{Th}+C_{TT}$, discharging the load capacitance $C_{L,B}$ to the twelfth step voltage V12 (equal to 12Vcc/14). Since switches S11a, S14, S21, S16, S19, S17, and S10a are open, load capacitor $C_{L,A}$ floats, and the charge on load capacitor $C_{L,A}$ therefore remains at its previous value of V2 (equal to 2Vcc/14).

During Phase 4, switches S15 and S17 close while the other switches open. This couples the tank capacitor $C_{Th}$ in series between the load capacitors $C_{L,A}$ and $C_{L,B}$. As a result, charge transfers from load capacitor $C_{L,B}$ to tank capacitor $C_{Th}$, discharging load capacitor $C_{L,B}$ to the eleventh step voltage V11 (equal to 11Vcc/14). In addition, charge transfers from tank capacitor $C_{Th}$ to load capacitor $C_{L,A}$, charging load capacitor $C_{L,A}$ to the third step voltage V3 (equal to 3Vcc/14).

During Phase 5, switches S13 and S21 close while the other switches open. This couples tank capacitor $C_{TT}$ between the load capacitor $C_{L,A}$ and ground. Charge transfers from the tank capacitor $C_{TT}$ to the load capacitor $C_{L,A}$, charging the load capacitor $C_{L,A}$ to the fourth step voltage V4 (equal to 4Vcc/14). Since switches S10b, S15, S22, S16, S20, S18, and S11b are open, load capacitor $C_{L,B}$ floats, and the charge on load capacitor $C_{L,B}$ therefore remains at its previous value of V11 (equal to 11Vcc/14).

During Phase 6, switches S20 and S24 close while the other switches open. This couples tank capacitor $C_{TT}$ between the supply voltage Vcc and the load capacitor $C_{L,B}$. As a result, charge transfers from the load capacitor $C_{L,B}$ to the tank capacitor $C_{TT}$, discharging the load capacitor $C_{L,B}$ to the tenth step voltage V10 (equal to 10Vcc/14). Since switches S11a, S14, S21, S16, S19, S17, and S10a are open, load capacitor $C_{L,A}$ floats, and the charge on load capacitor $C_{L,A}$ therefore remains at its previous value of V4 (equal to 4Vcc/14).

During Phase 7, switches S19 and S22 close while the other switches open. This couples tank capacitor $C_{TT}$ between the load capacitor $C_{L,A}$ and $C_{L,B}$. As a result, charge transfers from the load capacitor $C_{L,B}$ to the tank capacitor $C_{TT}$, discharging the load capacitor $C_{L,B}$ to the ninth step voltage V9 (equal to 9Vcc/14). In addition, charge transfers from the tank capacitor $C_{TT}$ to the load capacitor $C_{L,A}$, charging the load capacitor $C_{L,A}$ to the fifth step voltage V5 (equal to 5Vcc/14).

During Phase 8, switches S12 and S17 close, while the other switches open. This couples tank capacitor $C_{Th}$ between the supply voltage Vcc and load capacitor $C_{L,A}$. As a result, charge transfers from the tank capacitor $C_{Th}$ to the load capacitor $C_{L,A}$, charging the load capacitor $C_{L,A}$ to the sixth step voltage V6 (equal to 6Vcc/14). Since switches S10b, S15, S22, S16, S20, S18, and S11b are open, load capacitor $C_{L,B}$ floats, and the charge on load capacitor $C_{L,B}$ therefore remains at its previous value of V9 (equal to 9Vcc/14).

During Phase 9, switches S15 and S23 close, while the other switches open. This couples tank capacitor $C_{Th}$ between load capacitor $C_{L,B}$ and ground. Charge transfers from the load capacitor $C_{L,B}$ to the tank capacitor $C_{Th}$, and therefore the load capacitor $C_{L,B}$ discharges to the eighth step voltage V8 (equal to 8Vcc/14). Since switches S11a, S14, S21, S16, S19, S17, and S10a are open, load capacitor $C_{L,A}$ floats, and the charge on load capacitor $C_{L,A}$ therefore remains at its previous value of V6 (equal to 6Vcc/14).

During Phase 10, switch S16 closes, while the other switches open. This couples the load capacitor $C_{L,A}$ to the load capacitor $C_{L,B}$. Charge transfers from the load capacitor $C_{L,B}$ to the load capacitor $C_{L,A}$, and therefore both load capacitors $C_{L,A}$ and $C_{L,B}$ are set to the seventh step voltage V7 (equal to 7Vcc/14).

During Phase 11, switches S14 and S23 close, while the other switches open, coupling the tank capacitor $C_{Th}$ between the load capacitor $C_{L,A}$ and ground. As a result, charge transfers from the tank capacitor $C_{Th}$ to the load capacitor $C_{L,A}$, charging the load capacitor $C_{L,A}$ to the eighth step voltage V8 (equal to 8Vcc/14). Since switches S10b, S15, S22, S16, S20, S18, and S11b are open, load capacitor $C_{L,B}$ floats, and the charge on load capacitor $C_{L,B}$ therefore remains at its previous value of V7 (equal to 7Vcc/14).

During Phase 12, switches S12 and S18 close, while the other switches open, coupling the tank capacitor $C_{Th}$ between the supply voltage Vcc and the load capacitor $C_{L,B}$. As a result, charge transfers from the load capacitor $C_{L,B}$ to the tank capacitor $C_{Th}$, discharging the load capacitor $C_{L,B}$ to the sixth step voltage V6 (equal to 6Vcc/14). Since switches S11a, S14, S21, S16, S19, S17, and S10a are open, load capacitor $C_{L,A}$ floats, and the charge on load capacitor $C_{L,A}$ therefore remains at its previous value of V8 (equal to 8Vcc/14).

During Phase 13, switches S20 and S21 close, while the other switches open, coupling the tank capacitor $C_{TT}$ between load capacitor $C_{L,A}$ and load capacitor $C_{L,B}$. As a result, charge transfers from load capacitor $C_{L,B}$ to the tank capacitor $C_{TT}$ to discharge the load capacitor $C_{L,B}$ to the fifth step voltage V5 (equal to 5Vcc/14), and charge transfers from the tank capacitor $C_{TT}$ to the load capacitor $C_{L,A}$ to charge the load capacitor $C_{L,A}$ to the ninth step voltage V9 (equal to 9Vcc/14).

During Phase 14, switches S19 and S24 close, while the other switches open, coupling tank capacitor $C_{TT}$ between the supply voltage Vcc and the load capacitor $C_{L,A}$. As a result, charge transfers from the tank capacitor $C_{TT}$ to the load capacitor $C_{L,A}$, charging the load capacitor $C_{L,A}$ to the tenth step voltage V10 (equal to 10Vcc/14). Since switches S10b, S15, S22, S16, S20, S18, and S11b are open, load capacitor $C_{L,B}$ floats, and the charge on load capacitor $C_{L,B}$ therefore remains at its previous value of V5 (equal to 5Vcc/14).

During Phase 15, switches S13 and S22 close, while the other switches open, coupling tank capacitor $C_{TT}$ between the load capacitor $C_{L,B}$ and ground. As a result, charge transfers from the load capacitor $C_{L,B}$ to the tank capacitor $C_{TT}$ discharging the load capacitor $C_{L,B}$ to the fourth step voltage V4 (equal to 4Vcc/13). Since switches S11a, S14, S21, S16, S19, S17, and S10a are open, load capacitor $C_{L,A}$ floats, and the charge on load capacitor $C_{L,A}$ therefore remains at its previous value of V10 (equal to 10Vcc/14).

During Phase 16, switches S14 and S18 close, while the other switches open, coupling the tank capacitor $C_{TH}$ between the load capacitor $C_{L,A}$ and the load capacitor $C_{L,B}$. As a result, charge transfers from the load capacitor $C_{L,B}$ to the tank capacitor $C_{TH}$, discharging the load capacitor $C_{L,B}$ to the third step voltage V3 (equal to 3Vcc/14). In addition, charge transfers from the tank capacitor $C_{TH}$ to the load capacitor $C_{L,A}$, charging the load capacitor $C_{L,A}$ to the eleventh step voltage V11 (equal to 11Vcc/14).

During Phase 17, switches S13, S14, and S25 close while the other switches open, coupling tank capacitors $C_{Th}$ and $C_{TT}$ in series between the load capacitor $C_{L,A}$ and ground. As a result, charge transfers from the series capacitance $C_{Th}$+$C_{TT}$ to the load capacitor $C_{L,A}$, charging the load capacitor $C_{L,A}$ to the twelfth step voltage V12 (equal to 12Vcc/14). Since switches S10b, S15, S22, S16, S20, S18, and S11b are open, load capacitor $C_{L,B}$ floats, and the charge on load capacitor $C_{L,B}$ therefore remains at its previous value of V3 (equal to 3Vcc/14).

During Phase 18, switches S12, S20, and S25 close while the other switches open, coupling tank capacitors $C_{Th}$ and $C_{TT}$ in series between the supply voltage Vcc and the load capacitor $C_{L,B}$. As a result, charge transfers from the load capacitor $C_{L,B}$ to the series capacitance $C_{Th}$+$C_{TT}$ to thereby discharge the load capacitor $C_{L,B}$ to the second step voltage V2 (equal to 2Vcc/14). Since switches S11a, S14, S21, S16, S19, S17, and S10a are open, load capacitor $C_{L,A}$ floats, and the charge on load capacitor $C_{L,A}$ therefore remains at its previous value of V12 (equal to 12Vcc/14).

During Phase 19, switches S14, S20, and S25 close while the other switches open, coupling tank capacitors $C_{Th}$ and $C_{TT}$ in series between load capacitor $C_{L,A}$ and load capacitor $C_{L,B}$. As a result, charge transfers from the load capacitor $C_{L,B}$ to the series capacitance $C_{Th}$+$C_{TT}$ to thereby discharge the load capacitor $C_{L,B}$ to the first step voltage V1 (equal to Vcc/14). In addition, charge transfers from the series capacitance $C_{Th}$+$C_{TT}$ to the load capacitance $C_{L,A}$ charging the load capacitance $C_{L,A}$ to the thirteenth step voltage V13 (equal to 13Vcc/14).

During Phase 20, switches S11a and S11b close, coupling load capacitor $C_{L,A}$ to the supply voltage to charge load capacitor $C_{L,A}$ to Vcc, and coupling load capacitor $C_{L,B}$ to ground to fully discharge the load capacitor $C_{L,B}$ to ground.

It should be appreciated that the reverse transition on the load capacitors $C_{L,A}$ and $C_{L,B}$ is done when phases 19, 18, 17, 16, 15, 14, 13, 12, 11, 10, 9, 8, 7, 6, 5, 4, 3, 2, 1, and finally 0 are repeated, in that reverse order.

Returning to Phase 19, switches S14, S20, and S25 close while the other switches open, coupling tank capacitors $C_{Th}$ and $C_{TT}$ in series between load capacitor $C_{L,A}$ and load capacitor $C_{L,B}$. As a result, charge transfers from the load capacitor $C_{L,A}$ to the series capacitance $C_{Th}+C_{TT}$ to thereby discharge the load capacitor $C_{L,A}$ to the thirteenth step voltage V13 (equal to 13Vcc/14). In addition, charge transfers from the series capacitance $C_{Th}+C_{TT}$ to the load capacitance $C_{L,B}$ charging the load capacitance $C_{L,B}$ to the first step voltage V1 (equal to Vcc/14).

Returning to Phase 18, switches S12, S20, and S25 close while the other switches open, coupling tank capacitors $C_{Th}$ and $C_{TT}$ in series between the supply voltage Vcc and the load capacitor $C_{L,B}$. As a result, charge transfers from the series capacitance $C_{Th}+C_{TT}$ to the load capacitor $C_{L,B}$ to thereby charge the load capacitor $C_{L,B}$ to the second step voltage V2 (equal to 2Vcc/14). Since switches S11a, S14, S21, S16, S19, S17, and S10a are open, load capacitor $C_{L,A}$ floats, and the charge on load capacitor $C_{L,A}$ therefore remains at its previous value of V13 (equal to 13Vcc/14).

Returning to Phase 17, switches S13, S14, and S25 close while the other switches open, coupling tank capacitors $C_{Th}$ and $C_{TT}$ in series between the load capacitor $C_{L,A}$ and ground. As a result, charge transfers from the load capacitor $C_{L,A}$ to the series capacitance $C_{Th}+C_{TT}$, discharging the load capacitor $C_{L,A}$ to the twelfth step voltage V12 (equal to 12Vcc/14). Since switches S10b, S15, S22, S16, S20, S18, and S11b are open, load capacitor $C_{L,B}$ floats, and the charge on load capacitor $C_{L,B}$ therefore remains at its previous value of V2 (equal to 2Vcc/14).

Returning to Phase 16, switches S14 and S18 close, while the other switches open, coupling the tank capacitor $C_{TH}$ between the load capacitor $C_{L,A}$ and the load capacitor $C_{L,B}$. As a result, charge transfers from the load capacitor $C_{L,A}$ to the tank capacitor $C_{TH}$, discharging the load capacitor $C_{L,A}$ to the eleventh step voltage V11 (equal to 11Vcc/14). In addition, charge transfers from the tank capacitor $C_{TH}$ to the load capacitor $C_{L,B}$, charging the load capacitor $C_{L,B}$ to the third step voltage V3 (equal to 3Vcc/14).

Returning to Phase 15, switches S13 and S22 close, while the other switches open, coupling tank capacitor $C_{TT}$ between the load capacitor $C_{L,B}$ and ground. As a result, charge transfers from tank capacitor $C_{TT}$ to the the load capacitor $C_{L,B}$ to charge the load capacitor $C_{L,B}$ to the fourth step voltage V4 (equal to 4Vcc/13). Since switches S11a, S14, S21, S16, S19, S17, and S10a are open, load capacitor $C_{L,A}$ floats, and the charge on load capacitor $C_{L,A}$ therefore remains at its previous value of V11 (equal to 11Vcc/14).

Returning to Phase 14, switches S19 and S24 close, while the other switches open, coupling tank capacitor $C_{TT}$ between the supply voltage Vcc and the load capacitor $C_{L,A}$. As a result, charge transfers from the load capacitor $C_{L,A}$ to the tank capacitor $C_{TT}$ to discharge the load capacitor $C_{L,A}$ to the tenth step voltage V10 (equal to 10Vcc/14). Since switches S10b, S15, S22, S16, S20, S18, and S11b are open, load capacitor $C_{L,B}$ floats, and the charge on load capacitor $C_{L,B}$ therefore remains at its previous value of V4 (equal to 4Vcc/14).

Returning to Phase 13, switches S20 and S21 close, while the other switches open, coupling the tank capacitor $C_{TT}$ between load capacitor $C_{L,A}$ and load capacitor $C_{L,B}$. As a result, charge transfers from load capacitor $C_{L,A}$ to the tank capacitor $C_{TT}$ to discharge the load capacitor $C_{L,A}$ to the ninth step voltage V9 (equal to 9Vcc/14), and charge transfers from the tank capacitor $C_{TT}$ to the load capacitor $C_{L,B}$ to charge the load capacitor $C_{L,B}$ to the fifth step voltage V5 (equal to 5Vcc/14).

Returning to Phase 12, switches S12 and S18 close, while the other switches open, coupling the tank capacitor $C_{Th}$ between the supply voltage Vcc and the load capacitor $C_{L,B}$. As a result, charge transfers from the tank capacitor $C_{Th}$ to the load capacitor $C_{L,B}$ to charge the load capacitor $C_{L,B}$ to the sixth step voltage V6 (equal to 6Vcc/14). Since switches S11a, S14, S21, S16, S19, S17, and S10a are open, load capacitor $C_{L,A}$ floats, and the charge on load capacitor $C_{L,A}$ therefore remains at its previous value of V9 (equal to 9Vcc/14).

Returning to Phase 11, switches S14 and S23 close, while the other switches open, coupling the tank capacitor $C_{Th}$ between the load capacitor $C_{L,A}$ and ground. As a result, charge transfers from the load capacitor $C_{L,A}$ to the tank capacitor $C_{Th}$ to discharge the load capacitor $C_{L,A}$ to the eighth step voltage V8 (equal to 8Vcc/14). Since switches S10b, S15, S22, S16, S20, S18, and S11b are open, load capacitor $C_{L,B}$ floats, and the charge on load capacitor $C_{L,B}$ therefore remains at its previous value of V6 (equal to 6Vcc/14).

Returning to Phase 10, switch S16 closes, while the other switches open. This couples the load capacitor $C_{L,B}$ to the load capacitor $C_{L,A}$. Charge transfers from the load capacitor $C_{L,A}$ to the load capacitor $C_{L,B}$, and therefore both load capacitors $C_{L,A}$ and $C_{L,B}$ are set to the seventh step voltage V7 (equal to 7Vcc/14).

Returning to Phase 9, switches S15 and S23 close, while the other switches open. This couples tank capacitor $C_{Th}$ between load capacitor $C_{L,B}$ and ground. Charge transfers from the tank capacitor $C_{Th}$ to the load capacitor $C_{L,B}$ and therefore the load capacitor $C_{L,B}$ is charged to the eighth step voltage V8 (equal to 8Vcc/14). Since switches S11a, S14, S21, S16, S19, S17, and S10a are open, load capacitor $C_{L,A}$ floats, and the charge on load capacitor $C_{L,A}$ therefore remains at its previous value of V7 (equal to 7Vcc/14).

Returning to Phase 8, switches S12 and S17 close, while the other switches open. This couples tank capacitor $C_{Th}$ between the supply voltage Vcc and load capacitor $C_{L,A}$. As a result, charge transfers from the load capacitor $C_{L,A}$ to the tank capacitor $C_{Th}$ to discharge the load capacitor $C_{L,A}$ to the sixth step voltage V6 (equal to 6Vcc/14). Since switches S10b, S15, S22, S16, S20, S18, and S11b are open, load capacitor $C_{L,B}$ floats, and the charge on load capacitor $C_{L,B}$ therefore remains at its previous value of V8 (equal to 8Vcc/14).

Returning to Phase 7, switches S19 and S22 close while the other switches open. This couples tank capacitor $C_{TT}$ between the load capacitor $C_{L,A}$ and $C_{L,B}$. As a result, charge transfers from the tank capacitor $C_{TT}$ to the load capacitor $C_{L,B}$ to charge the load capacitor $C_{L,B}$ to the ninth step voltage V9 (equal to 9Vcc/14). In addition, charge transfers from the load capacitor $C_{L,A}$ to the tank capacitor $C_{TT}$ to discharge the load capacitor $C_{L,A}$ to the fifth step voltage V5 (equal to 5Vcc/14).

Returning to Phase 6, switches S20 and S24 close while the other switches open. This couples tank capacitor $C_{TT}$ between the supply voltage Vcc and the load capacitor $C_{L,B}$. As a result, charge transfers from the tank capacitor $C_{TT}$ to the load capacitor $C_{L,B}$ to charge the load capacitor $C_{L,B}$ to the tenth step voltage V10 (equal to 10Vcc/14). Since switches S11a, S14, S21, S16, S19, S17, and S10a are open, load capacitor $C_{L,A}$ floats, and the charge on load capacitor $C_{L,A}$ therefore remains at its previous value of V5 (equal to 5Vcc/14).

Returning to Phase 5, switches S13 and S21 close while the other switches open. This couples tank capacitor $C_{TI}$ between the load capacitor $C_{L,A}$ and ground. Charge transfers from the load capacitor $C_{L,A}$ to the tank capacitor $C_{TI}$ to discharge the load capacitor $C_{L,A}$ to the fourth step voltage V4 (equal to 4Vcc/14). Since switches S10b, S15, S22, S16, S20, S18, and S11b are open, load capacitor $C_{L,B}$ floats, and the charge on load capacitor $C_{L,B}$ therefore remains at its previous value of V10 (equal to 10Vcc/14).

Returning to Phase 4, switches S15 and S17 close while the other switches open. This couples the tank capacitor $C_{Th}$ between the load capacitors $C_{L,A}$ and $C_{L,B}$. As a result, charge transfers from load capacitor $C_{L,A}$ to tank capacitor $C_{Th}$, discharging load capacitor $C_{L,A}$ to the third step voltage V3 (equal to 3Vcc/14). In addition, charge transfers from tank capacitor $C_{Th}$ to load capacitor $C_{L,B}$, charging load capacitor $C_{L,B}$ to the eleventh step voltage V11 (equal to 11Vcc/14).

Returning to Phase 3, switches S13, S15, and S25 close while the other switches open, connecting tank capacitors $C_{Th}$ and $C_{TI}$ in series between load capacitance $C_{L,B}$ and ground. As a result, the series capacitance $C_{Th}+C_{TI}$ transfers charge to the load capacitance $C_{L,B}$ to charge the load capacitance $C_{L,B}$ to the twelfth step voltage V12 (equal to 12Vcc/14). Since switches S11a, S14, S21, S16, S19, S17, and S10a are open, load capacitor $C_{L,A}$ floats, and the charge on load capacitor $C_{L,A}$ therefore remains at its previous value of V3 (equal to 3Vcc/14).

Returning to Phase 2, switches S12, S19, and S25 close while the other switches open, connecting tank capacitors $C_{Th}$ and $C_{TI}$ in series between the supply voltage Vcc and the load capacitor $C_{L,A}$. As a result, the load capacitor $C_{L,A}$ transfers charge to the series capacitance $C_{Th}+C_{TI}$ to discharge the load capacitor $C_{L,A}$ to the second step voltage V2 (equal to 2Vcc/14). Since switches S10b, S15, S22, S16, S20, S18, and S11b are open, load capacitor $C_{L,B}$ floats, and the charge on load capacitor $C_{L,B}$ therefore remains at its previous value of V12 (equal to 12Vcc/14).

Returning to Phase 1, switches S15, S19, and S25 close while the other switches open, connecting tank capacitors $C_{Th}$ and $C_{TI}$ in series between load capacitors $C_{L,B}$ and $C_{L,A}$. As a result, series capacitance of $C_{Th}+C_{TI}$ transfers charge to the load capacitor $C_{L,B}$ to charge the load capacitor $C_{L,B}$ to the thirteenth step voltage V13 (equal to 13Vcc/14), and the load capacitor $C_{L,A}$ transfers charge to the series capacitance of $C_{Th}+C_{TI}$, discharging the load capacitor $C_{L,A}$ to the first step voltage V1 (equal to Vcc/14).

Returning to Phase 0, switches S10a, S10b close, coupling the load capacitor $C_{L,A}$ to ground to discharge it to ground, and coupling the load capacitor $C_{L,B}$ to the supply voltage Vcc to charge it to Vcc, as can be observed in FIG. 12B. Therefore, the full cycle of operation of the charge recovery driver 80 has been described. As to power dissipation, if $C_{L,A}=C_{L,B}=C$, with N representing the number of voltage steps (here, there are fourteen steps between ground and Vcc) then the power dissipation of this charge recovery driver 80 is $(2CV^2f)/N$. Thus, this charge recovery driver 80 has reduced power dissipation by a factor of N=14, using M=2 tank capacitors and 18 switches, thereby reducing external capacitors number and on-chip area consumption as compared to prior art designs relative to fourteen step voltage levels, which are usually done utilizing 13 tank capacitors and 30 switches.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A charge recovery driver for a pair of loads, comprising:
   a first tank capacitor having a first terminal, and having a second terminal coupled to ground;
   a second tank capacitor having a first terminal, and having a second terminal coupled to ground;
   first and second output nodes coupled to the pair of loads;
   a first switch circuit configured to selectively couple the first terminal of the first tank capacitor to the first and/or second output nodes;
   a second switch circuit including a single switch directly electrically connected between the first and second output nodes, the second switch circuit being configured to selectively couple the first and second output nodes to one another;
   a third switch circuit configured to selectively couple the first terminal of the second tank capacitor to the first and/or second output nodes;
   a fourth switch circuit configured to selectively couple the first output node between a supply voltage and/or ground;
   a fifth switch circuit configured to selectively couple the second output node between the supply voltage and/or ground; and
   control circuitry configured to:
      a) cause the fourth switch circuit to couple the first output node to ground and cause the fifth switch circuit to couple the second output node to the supply voltage during an initial phase;
      b) cause the first switch circuit to couple the first output node to the first terminal of the first tank capacitor and cause the third switch circuit to couple the second output node to the first terminal of the second tank capacitor during a first phase;
      c) cause the second switch circuit to couple the first and second output nodes to one another, during a second phase;
      d) cause the first switch circuit to couple the second output node to the first terminal of the first tank capacitor and cause the third switch circuit to couple the first output node to the first terminal of the second tank capacitor during a third phase;
      e) cause the fourth switch circuit to couple the first output node to the supply voltage and the fifth switch circuit to couple the second output node to ground during a fourth phase; and
      perform d), c), b), and a).

2. The charge recovery driver of claim 1, wherein the pair of loads comprise actuators for a microelectromechanical systems (MEMS) device.

3. The charge recovery driver of claim 1, wherein the first switch circuit comprises a first switch coupled between the first output node and the first terminal of the first tank capacitor, and a second switch coupled between the second output node and the first terminal of the first tank capacitor.

4. The charge recovery driver of claim 1, wherein the third switch circuit comprises a fourth switch coupled between the first output node and the first terminal of the second tank capacitor, and a fifth switch coupled between the second output node and the first terminal of the second tank capacitor.

5. The charge recovery driver of claim 1, wherein the fourth switch circuit comprises a sixth switch coupled between the supply voltage and the first output node, and a seventh switch coupled between the first output node and ground.

6. The charge recovery driver of claim 1, wherein the fifth switch circuit comprises an eighth switch coupled between the supply voltage and the second output node, and a ninth switch coupled between the second output node and ground.

7. A charge recovery driver for a pair of loads, comprising:
a tank capacitor having first and second terminals;
first and second output nodes coupled to the pair of loads;
a first switch circuit configured to selectively couple the second terminal of the tank capacitor to the first and/or second output nodes;
a second switch circuit configured to selectively couple the first and second output nodes to one another;
a third switch circuit configured to selectively couple the first terminal of the tank capacitor to the first and/or second output nodes;
a fourth switch circuit configured to selectively couple the first output node between a supply voltage and/or ground;
a fifth switch circuit configured to selectively couple the second output node between the supply voltage and/or ground; and
control circuitry configured to:
a) cause the fourth switch circuit to couple the first output node to ground and to cause the fifth switch circuit to couple the second output node to the supply voltage during an initial phase;
b) cause the third switch circuit to couple the first terminal of the tank capacitor to the second output node and the first switch circuit to couple the second terminal of the tank capacitor to the first output node during a first phase;
c) cause the second switch circuit to couple the first and second output nodes to one another during a second phase;
d) cause the third switch circuit couple the first terminal of the tank capacitor to the first output node and the first switch circuit to couple the second terminal of the tank capacitor to the second output node during a third phase;
e) cause the fourth switch circuit to couple the first output node to the supply voltage and the fifth switch circuit to couple the second output node to ground during a fourth phase; and
perform d), c), b), and a).

8. The charge recovery driver of claim 7, wherein the pair of loads comprise actuators for a microelectromechanical systems (MEMS) device.

9. The charge recovery driver of claim 7, wherein the first switch circuit comprises a first switch coupled between the first output node and the second terminal of the tank capacitor, and a second switch coupled between the second output node and the second terminal of the tank capacitor.

10. The charge recovery driver of claim 7, wherein the second switch circuit comprises a third switch coupled between the first and second output nodes.

11. The charge recovery driver of claim 7, wherein the third switch circuit comprises a fourth switch coupled between the first output node and the first terminal of the tank capacitor and a fifth switch coupled between the second output node and the first terminal of the tank capacitor.

12. The charge recovery driver of claim 7, wherein the fourth switch circuit comprises a sixth switch coupled between the supply voltage and the first output node, and a seventh switch coupled between the first output node and ground.

13. The charge recovery driver of claim 7, wherein the fifth switch circuit comprises an eighth switch coupled between the supply voltage and the second output node, and a ninth switch coupled between the second output node and ground.

14. A charge recovery driver for a pair of loads, comprising:
a first tank capacitor having first and second terminals;
a second tank capacitor having first and second terminals;
first and second output nodes coupled to the pair of loads;
a first switch circuit configured to selectively couple the second terminal of the first tank capacitor to the first and/or second output nodes;
a second switch circuit configured to selectively couple the second terminal of the second tank capacitor to the first and/or second output nodes;
a third switch circuit configured to selectively couple the first and second output nodes to one another;
a fourth switch circuit configured to selectively couple the first terminal of the second tank capacitor to the first and/or second output nodes;
a fifth switch circuit configured to selectively couple the first terminal of the first tank capacitor to the first and/or second output nodes;
a sixth switch circuit configured to selectively couple the first output node between a supply voltage and/or ground;
a seventh switch circuit configured to selectively couple the second output node between the supply voltage and/or ground; and
control circuitry configured to:
a) cause the sixth switch circuit to couple the first output node to ground and cause the seventh switch circuit to couple the second output node to the supply voltage during an initial phase;
b) cause the first switch circuit to couple the second terminal of the first tank capacitor to the first output node and the fifth switch circuit to couple the first terminal of the first tank capacitor to the second output node during a first phase;
c) cause the second switch circuit to couple the second terminal of the second tank capacitor to the first output node and the fourth switch circuit to couple the first terminal of the second tank capacitor to the second output node during a second phase;
d) cause the third switch circuit to couple the first and second output nodes to one another during a third phase;
e) cause the fourth switch circuit to couple the first terminal of the second tank capacitor to the first output node and the second switch circuit to couple the second terminal of the second tank capacitor to the second output node during a fourth phase;
f) cause the fifth switch circuit to couple the first terminal of the first tank capacitor to the first output node and the first switch circuit to couple the second terminal of the first tank capacitor to the second output node during a fifth phase;
g) cause the sixth switch circuit to couple the first output node to the supply voltage and the seventh switch circuit to couple the second output node to ground during a sixth phase; and perform f), e), d), c), b), and a).

15. The charge recovery driver of claim 14, wherein the pair of loads comprise actuators for a microelectromechanical systems (MEMS) device.

16. The charge recovery driver of claim 14, wherein the first switch circuit comprises a first switch coupled between the first output node and the second terminal of the first tank capacitor, and a second switch coupled between the second output node and the second terminal of the first tank capacitor.

17. The charge recovery driver of claim 14, wherein the second switch circuit comprises a third switch coupled between the first output node and the second terminal of the second tank capacitor, and a fourth switch coupled between the second output node and the second terminal of the second tank capacitor.

18. The charge recovery driver of claim 14, wherein the third switch circuit comprises a fifth switch coupled between the first and second output nodes.

19. The charge recovery driver of claim 14, wherein the fourth switch circuit comprises a sixth switch coupled between the first output node and the first terminal of the second tank capacitor, and a seventh switch coupled between the second output node and the first terminal of the second tank capacitor.

20. The charge recovery driver of claim 14, wherein the fifth switch circuit comprises an eighth switch coupled between the first output node and the first terminal of the first tank capacitor, and a ninth switch coupled between the second output node and the first terminal of the first tank capacitor.

21. The charge recovery driver of claim 14, wherein the sixth switch circuit comprises a tenth switch coupled between the supply voltage and the first output node, and an eleventh switch coupled between the first output node and ground.

22. The charge recovery driver of claim 14, wherein the seventh switch circuit comprises a twelfth switch coupled between the supply voltage and the second output node, and a thirteenth switch coupled between the second output node and ground.

23. A charge recovery driver for a pair of loads, comprising:
- a tank capacitor having first and second terminals;
- first and second output nodes coupled to the pair of loads;
- a first switch circuit configured to selectively couple the second terminal of the tank capacitor to a first output node and/or a second output node;
- a second switch circuit configured to selectively couple the first and second output nodes to one another;
- a third switch circuit configured to selectively couple the first terminal of the tank capacitor to the first output node and/or the second output node;
- a fourth switch circuit configured to selectively couple the second terminal of the tank capacitor to ground;
- a fifth switch circuit configured to selectively couple the first terminal of the tank capacitor to a supply voltage;
- a sixth switch circuit configured to selectively couple the first output node between the supply voltage and/or ground;
- a seventh switch circuit configured to selectively couple the second output node between the supply voltage and/or ground; and
- control circuitry configured to:
  a) cause the sixth switch circuit to couple the first output node to ground and cause the seventh switch circuit to couple the second output node to the supply voltage during an initial phase;
  b) cause the first switch circuit to couple the second terminal of the tank capacitor to the first output node and the third switch circuit to couple the first terminal of the tank capacitor to the second output node during a first phase;
  c) cause the first switch circuit to couple the second terminal of the tank capacitor to the first output node and the fifth switch circuit to couple the first terminal of the tank capacitor to the supply voltage during a second phase, while allowing the second output node to float;
  d) cause the third switch circuit to couple the first terminal of the tank capacitor to the second output node and the fourth switch circuit to couple the second terminal of the tank capacitor to ground during a third phase, while allowing the first output node to float;
  e) cause the second switch circuit to couple the first and second output nodes to one another during a fourth phase;
  f) cause the third switch circuit to couple the first terminal of the tank capacitor to the first output node and the fourth switch circuit to couple the second terminal of the tank capacitor to ground during a fifth phase, while allowing the second output node to float;
  g) cause the first switch circuit to couple the second terminal of the tank capacitor to the second output node and the fifth switch circuit to couple the first terminal of the tank capacitor to the supply voltage during a sixth phase, while allowing the first output node to float;
  h) cause the first switch circuit to couple the second terminal of the tank capacitor to the second output node and the third switch circuit to couple the first terminal of the tank capacitor to the first output node during a seventh phase;
  i) cause the sixth switch circuit to couple the first output node to the supply voltage and cause the seventh switch circuit to couple the second output node to ground; and perform h), g), f), e), d), c), b), and a).

24. The charge recovery driver of claim 23, wherein the pair of loads comprise actuators for a microelectromechanical systems (MEMS) device.

25. The charge recovery drive of claim 23, wherein c) and d) are permuted and/or f) and g) are permuted.

26. The charge recovery driver of claim 23, wherein the first switch circuit comprises a first switch coupled between the first output node and the second terminal of the tank capacitor, and a second switch coupled between the second output node and the second terminal of the tank capacitor.

27. The charge recovery driver of claim 23, wherein the second switch circuit comprises a third switch coupled between the first and second output nodes.

28. The charge recovery driver of claim 23, wherein the third switch circuit comprises a fourth switch coupled between the first output node and the first terminal of the tank capacitor, and a fifth switch coupled between the second output node and the first terminal of the tank capacitor.

29. The charge recovery driver of claim 23, wherein the fourth switch circuit comprises a sixth switch coupled between the second terminal of the tank capacitor and ground.

30. The charge recovery driver of claim 23, wherein the fifth switch circuit comprises a seventh switch coupled between the first terminal of the tank capacitor and the supply voltage.

31. The charge recovery driver of claim 23, wherein the sixth switch circuit comprises an eighth switch coupled between the supply voltage and the first output node, and a ninth switch coupled between the first output node and ground.

32. The charge recovery driver of claim 23, wherein the seventh switch circuit comprises a tenth switch coupled between the supply voltage and the second output node, and an eleventh switch coupled between the second output node and ground.

33. A method of operating charge recovery driver, the method comprising:
   a) coupling a first output node to ground and coupling a second output node to a supply voltage, while leaving first and second terminals of at least one tank capacitor floating during an initial phase;
   b) causing charge transfer from the second output node to the at least one tank capacitor, and from the at least one tank capacitor to the first output node, by coupling the first terminal of the at least one tank capacitor to the second output node and by coupling the second terminal of the at least one tank capacitor to the first output node during a first intermediate phase;
   c) causing charge equalization between the first and second output nodes by coupling the first and second output nodes to one another, while leaving the first and second terminals of the at least one tank capacitor floating during a second intermediate phase;
   d) causing charge transfer from the second output node to the at least one tank capacitor, and from the at least one tank capacitor to the first output node, by coupling the second terminal of the at least one tank capacitor to the second output node and by coupling the first terminal of the at least one tank capacitor to the first output node during a third intermediate phase;
   e) coupling the first output node to the supply voltage and coupling the second output node to ground, while leaving first and second terminals of at least one tank capacitor floating during a final phase; and
   perform d), c), b), and a).

34. The method of claim 33, further comprising repeating b) a given number of times before performing c).

35. The method of claim 33, further comprising repeating d) a given number of times before performing e).

36. The method of claim 33, wherein the at least one tank capacitor comprises first and second tank capacitors; and
   wherein b) comprises:
      b1) causing charge transfer from the second output node to the first tank capacitor, and from the first tank capacitor to the first output node, by coupling the first terminal of the first tank capacitor to the second output node and by coupling the second terminal of the first tank capacitor to the first output node; and
      b2) causing charge transfer from the second output node to the second tank capacitor, and from the second tank capacitor to the first output node, by coupling the first terminal of the second tank capacitor to the second output node, and by coupling the second terminal of the second tank capacitor to the first output node.

37. The method of claim 36, wherein d) comprises:
   d1) causing transfer of charge from the second output node to the second tank capacitor, and from the second tank capacitor to the first output node, by coupling the second terminal of the second tank capacitor to the second output node and by coupling the first terminal of the second tank capacitor to the first output node; and
   d2) causing transfer of charge from the second output node to the first tank capacitor, and from the first tank capacitor to the first output node, by coupling the second terminal of the first tank capacitor to the second output node and by coupling the first terminal of the first tank capacitor to the first output node.

38. The method of claim 33, wherein b) is split into two subsequent sub-phases, which can be executed in any order:
   b1) causing charge transfer from the second output node to the at least one tank capacitor, by coupling the first terminal of the at least one tank capacitor to the second output node and by coupling the second terminal of the at least one tank capacitor to ground, during a first intermediate sub-phase; and
   b2) causing charge transfer from the at least one tank capacitor to the first output node, by coupling the first terminal of the at least one tank capacitor to the supply voltage and by coupling the second terminal of the at least one tank capacitor to the first output node, during a second intermediate sub-phase.

39. The method of claim 38, wherein d) is split into two subsequent sub-phases, which can be executed in any order:
   d1) causing charge transfer from the second output node to the at least one tank capacitor, by coupling the first terminal of the at least one tank capacitor to the supply voltage and by coupling the second terminal of the at least one tank capacitor to the second output node, during a first intermediate sub-phase; and
   d2) causing charge transfer from the at least one tank capacitor to the first output node, by coupling the first terminal of the at least one tank capacitor to the first output node and by coupling the second terminal of the at least one tank capacitor to ground, during a second intermediate sub-phase.

40. The method of claim 34, wherein b) is split into two subsequent sub-phases, which can be executed in any order:
   b1) causing charge transfer from the second output node to the at least one tank capacitor, by coupling the first terminal of the at least one tank capacitor to the second output node and by coupling the second terminal of the at least one tank capacitor to ground, during a first intermediate sub-phase; and
   b2) causing charge transfer from the at least one tank capacitor to the first output node, by coupling the first terminal of the at least one tank capacitor to the supply voltage and by coupling the second terminal of the at least one tank capacitor to the first output node, during a second intermediate sub-phase.

41. The method of claim 40, wherein d) is split into two subsequent sub-phases, which can be executed in any order:
   d1) causing charge transfer from the second output node to the at least one tank capacitor, by coupling the first terminal of the at least one tank capacitor to the supply voltage and by coupling the second terminal of the at least one tank capacitor to the second output node, during a first intermediate sub-phase; and d2) causing charge transfer from the at least one tank capacitor to the first output node, by coupling the first terminal of the at least one tank capacitor to the first output node and by coupling the second terminal of the at least one tank capacitor to ground, during a second intermediate sub-phase.

42. The method of claim 35, wherein b) is split into two subsequent sub-phases, which can be executed in any order:
- b1) causing charge transfer from the second output node to the at least one tank capacitor, by coupling the first terminal of the at least one tank capacitor to the second output node and by coupling the second terminal of the at least one tank capacitor to ground, during a first intermediate sub-phase; and
- b2) causing charge transfer from the at least one tank capacitor to the first output node, by coupling the first terminal of the at least one tank capacitor to the supply voltage and by coupling the second terminal of the at least one tank capacitor to the first output node, during a second intermediate sub-phase.

43. The method of claim 42, wherein d) is split into two subsequent sub-phases, which can be executed in any order:
- d1) causing charge transfer from the second output node to the at least one tank capacitor, by coupling the first terminal of the at least one tank capacitor to the supply voltage and by coupling the second terminal of the at least one tank capacitor to the second output node, during a first intermediate sub-phase; and
- d2) causing charge transfer from the at least one tank capacitor to the first output node, by coupling the first terminal of the at least one tank capacitor to the first output node and by coupling the second terminal of the at least one tank capacitor to ground, during a second intermediate sub-phase.

* * * * *